US006973228B2

(12) United States Patent
Chang et al.

(10) Patent No.: US 6,973,228 B2
(45) Date of Patent: Dec. 6, 2005

(54) WAVELENGTH STABILIZING APPARATUS AND CONTROL METHOD

(75) Inventors: Chii-How Chang, Taoyuan (TW); Sean Chang, Taoyuan (TW)

(73) Assignee: Delta Electrics, Inc., (TW)

(*) Notice: Subject to any disclaimer, the term of this patent is extended or adjusted under 35 U.S.C. 154(b) by 222 days.

(21) Appl. No.: 10/712,368

(22) Filed: Nov. 12, 2003

(65) Prior Publication Data

US 2005/0018995 A1 Jan. 27, 2005

(30) Foreign Application Priority Data

Jul. 23, 2003 (TW) .............................. 92120075 A

(51) Int. Cl.[7] ............................. G02B 6/00; H01S 3/13

(52) U.S. Cl. .......................... 385/14; 385/24; 385/147; 372/32; 398/196; 398/198

(58) Field of Search ............................... 372/9, 20, 31, 372/32

(56) References Cited

U.S. PATENT DOCUMENTS 6,122,087 A * 9/2000 Nogiwa et al. ............. 398/196
6,243,403 B1 * 6/2001 Broutin et al. ................ 372/32
6,560,252 B1 * 5/2003 Colbourne et al. ........... 372/32
2003/0035617 A1 * 2/2003 Plourde et al. ............... 385/24
2003/0138007 A1 * 7/2003 Lee et al. ...................... 372/32
2003/0174743 A1 * 9/2003 Cliche et al. ................. 372/20
2004/0101319 A1 * 5/2004 Choi et al. .................. 398/196
2004/0120721 A1 * 6/2004 Wang et al. ................ 398/195

* cited by examiner

*Primary Examiner*—Michelle Connelly-Cushwa
(74) *Attorney, Agent, or Firm*—Martine Penilla & Gencarella, LLP

(57) ABSTRACT

A wavelength stabilizing apparatus utilized in an optical communication system for controlling a light wave output from a tunable optical component is disclosed. The wavelength stabilizing apparatus includes a coarse-tuning element, a fine-tuning element, and a servo element. When the wavelength stabilizing apparatus is used, the light wave output from the tunable optical component is directed into the coarse-tuning element and the fine-tuning element, respectively, and then transformed into electric signals to be received by the servo element. Particularly, the electric signals from the coarse-tuning element are served as basis for coarse-tuning and channel recognition of the light wave output from the tunable optical component while the electric signals from the fine-tuning element are served for fine-tuning and servo control of the light wave output from the tunable optical component. These electric signals are also processed with a logical operation to obtain a control signal for controlling the tunable optical component.

26 Claims, 17 Drawing Sheets

WAVELENGTH STABILIZING APPARATUS AND CONTROL METHOD

BACKGROUND OF THE INVENTION

1. Field of the Invention

The present invention relates to a wavelength stabilizing apparatus and related control method for a light wave and, more specifically, to a wavelength stabilizing apparatus that precisely locates the correct channel of a light-wave including specific wavelength output by a tunable optical element in an optical communication system, and the related control method.

2. Description of the Related Art

In optical communication systems, it is the usual case that one ordinarily skilled in the art uses a tunable optical element such as tunable laser source to output a light wave located in a channel of specific wavelength to carry optical signals to be transmitted. However, the channel of specific wavelength of the light wave output by the tunable optical element may derive from the desired channel of that specific wavelength. Therefore, a wavelength stabilizer would be used to servo control the light output by the tunable optical element so that a channel of the specific wavelength can be desirably located. For example, the U.S. Pat. No. 6,289,028 has disclosed related techniques.

FIG. 1 shows the arrangement of a wavelength stabilizer in a prior tunable laser system. As shown in FIG. 1, one part of the light wave output by the tunable light source 1 is received directly by a fiber path 2, while the other part is received by the wavelength stabilizer 4. Through a servo control for the tunable light source 1 by the wavelength stabilizer 4 and a control unit 3, the light wave output by the tunable light source 1 is tuned then.

As the light wave 11 enters the wavelength stabilizer 4, it is divided into two parts by the beam splitter 41. One part 12 passes a Fabry-Perot Etalon 42 and then directed into a photo-detector 44, while the other part 13 passes another Fabry-Perot Etalon 43 and then directed into another photo-detector 45. These photo-detectors 44 and 45 transform the input light signals into electronic signals and output these electronic signals to a signal processing and regulating unit 5. After the electronic signals are processed and regulated, a control signal would be output to the control unit 3.

FIG. 2A shows the relation between wavelength and transmittance (energy ratio of the light wave passing through a Fabry-Perot Etalon to that entering a Fabry-Perot Etalon) for a Fabry-Perot Etalon. As shown in FIG. 2A, the response curves of the photo-detectors 44 and 45 corresponding to light waves passing through the Fabry-Perot Etalons 42 and 43 are illustrated. PD1 is the response curve corresponding to the light wave 12 passing through the Fabry-Perot Etalon 42, while PD2 is the response curve corresponding to the light wave 13 passing through the Fabry-Perot Etalon 43. On the other hand, FIG. 2B shows the voltage variation between the response curves PD1 and PD2 (PD1–PD2) in FIG. 2A. As shown in FIG. 2B, the deviation between some differential signal 402 and a settle point 401 is served as an error signal for the signal processing and regulating unit 5 to make a servo control.

However, the well-known wavelength stabilizer has disadvantages in application. Take the U.S. Pat. No. 6,289,028 as an example, the use of the two rotatable Fabry-Perot Etalon may have uneasy positioning and wear problems as well as limitations in application, and therefore results in poor accuracy and re-productivity in manufacturing.

Also, since the above-mentioned wavelength stabilizer uses merely the voltage difference (PD1–PD2) to servo control in application, and since an incident light wave has various channels such as $\lambda_1$, $\lambda_2$, $\lambda_3$ . . . shown in FIG. 2B, it is difficult to precisely recognize and locate a specific channel among so many channels, and it is possible to locate at a wrong channel.

Therefore, the invention provides a wavelength stabilizing apparatus and the corresponding method to solve the above-mentioned problems, so that a light wave having specific wavelength can be precisely output within a correct channel, and the manufacturing becomes more convenient and less cost consuming.

SUMMARY OF THE INVENTION

The present invention provides a wavelength stabilizing apparatus having a coarse-tuning module and a fine-tuning module. The wavelength stabilizing apparatus precisely locates each channel of an output light wave including specific wavelength, and make the manufacturing convenient.

The invention also provides a wavelength stabilizing control method for watching the tunable optical element to ensure that the light wave including specific wavelength is output with each channel precisely located.

The wavelength stabilizing apparatus according to the present invention includes a coarse-tuning module, a fine-tuning module, and a servo element. The coarse-tuning module takes the transmittance of the light wave as basis for coarse-tuning and channel recognition of the light wave output by a tunable optical element, and takes the difference between the electrical signals received by the fine-tuning module as an error signal for fine-tuning and servo control. These electrical signals are processed with a logic calculation to output a control signal to a control unit for controlling the tunable light source.

In comparison with the prior art, the present invention is provided with a fine-tuning module but not another one Fabry-Perot Etalon to ensure that a light wave including specific wavelength received by an optical fiber is output with each channel correctly located. Thereby, the accuracy and re-productivity in manufacturing is better than ever.

DESCRIPTION OF THE PREFERRED EMBODIMENTS

Hereinafter, the wavelength stabilizing apparatus and the corresponding control method for a tunable optical element in an optical communication system according to the invention will be described by embodiments with reference to the attached drawings, and the statements of the similar parts would be described in one time only for simplification.

[The First Embodiment]

Figure 1:
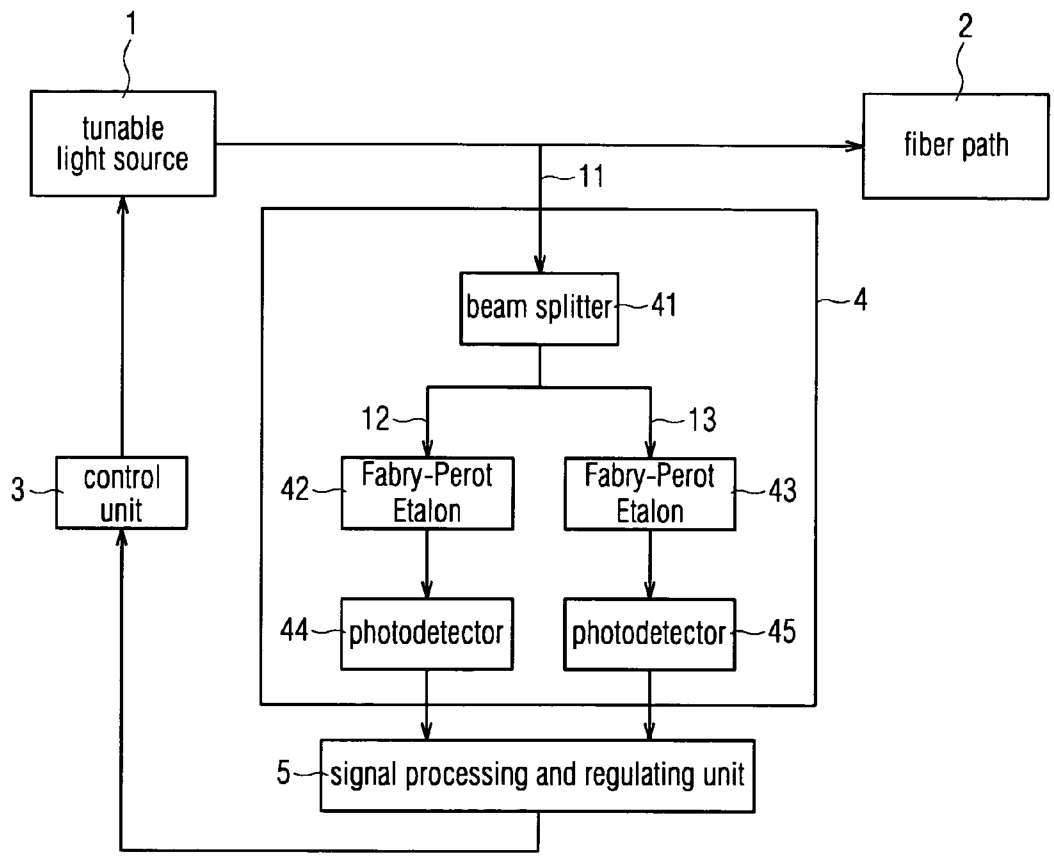
FIG. 1 is a schematic diagram showing an arrangement of a conventional wavelength stabilizing apparatus.
Figure 2A:
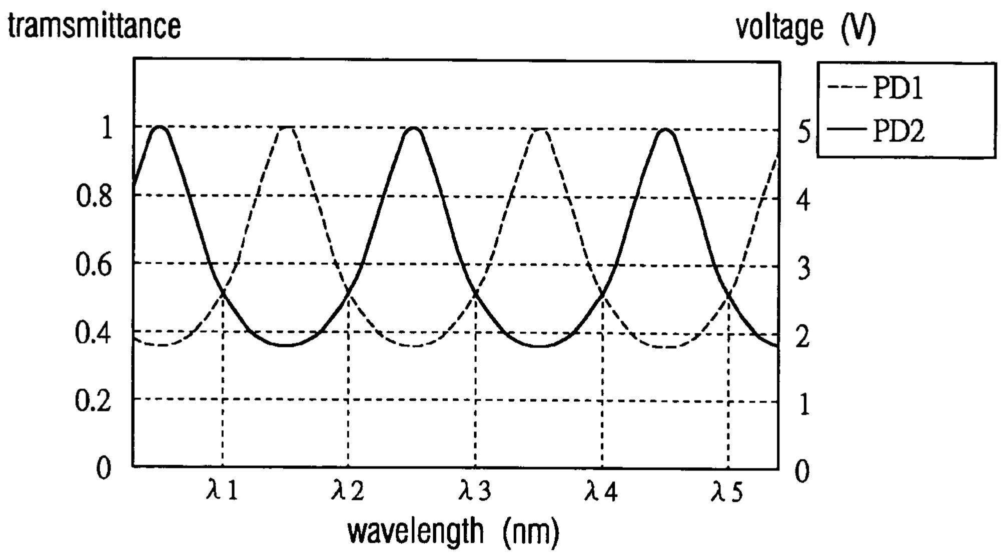
FIG. 2A is a spectrum diagram showing a relationship between wavelength and response voltage.
Figure 2B:
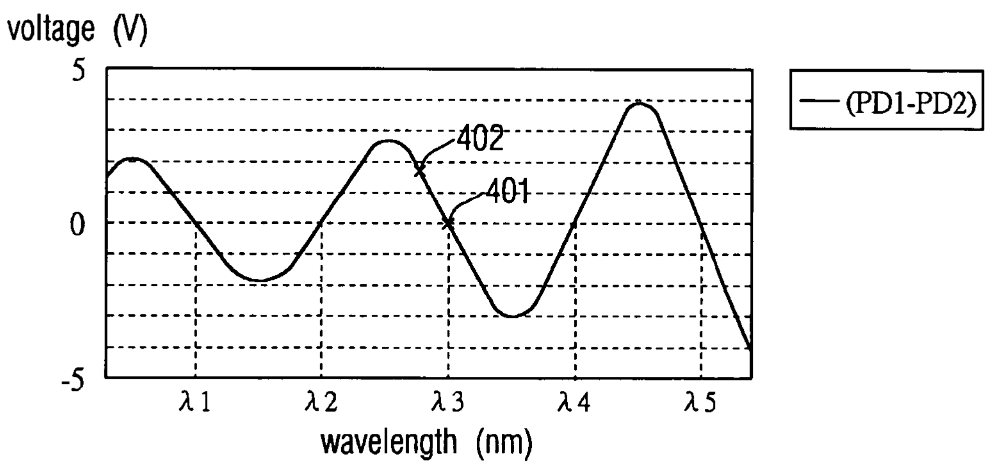
FIG. 2B is a spectrum diagram showing a relationship between wavelength and response voltage difference.
Figure 3A:
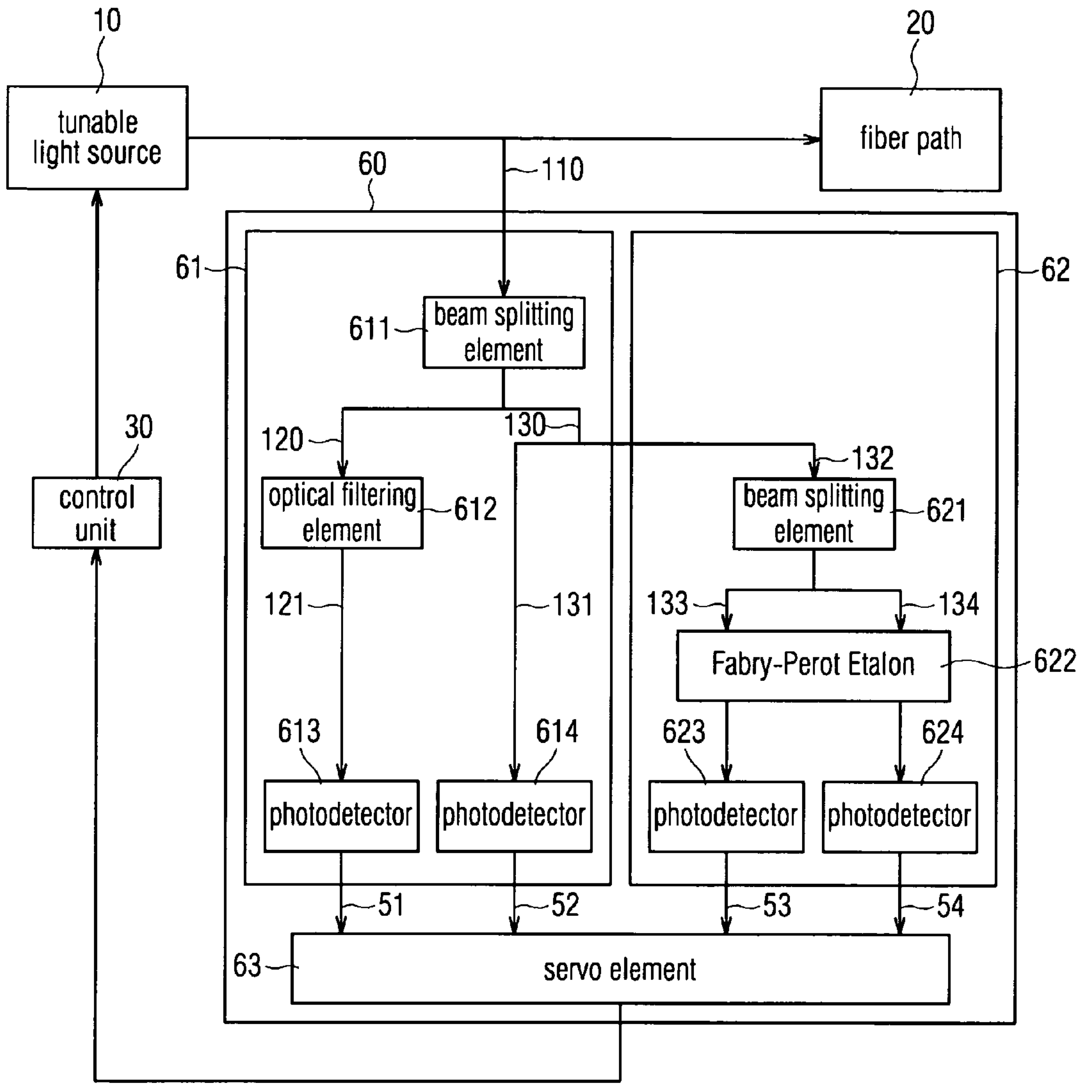
FIG. 3A is a schematic diagram showing an arrangement of the wavelength stabilizing apparatus according to first embodiment of the invention.

Referring to FIG. 3A, the wavelength stabilizing apparatus 60 for a tunable optical element such as the tunable light source 10 in an optical communication system according to the first embodiment of invention includes a coarse-tuning module 61, a fine-tuning module 62, and a servo element 63. As shown in FIG. 3A, the wavelength stabilizing apparatus 60 receives one part 110 of the light output by the tunable light source 10 to a fiber path 20 and servo controls the light in coordination with the control unit 30.

The coarse-tuning module 61 includes a beam-splitting element 611, an optical filtering element 612, and two photo-detecting elements such as photo-detectors 613 and 614. The beam-splitting element 611 is provided with a first coated-film surface (not shown) and a second coated-film surface (not shown). The fine-tuning module 62 includes a beam-splitting element 621, a Fabry-Perot Etalon 622, and two photo-detectors 623 and 624.

The wavelength stabilizing control process according to this embodiment is described as follows.

First of all, the light wave 110 entering a beam-splitting element 611 is divided into light waves 120 and 130 through the first coated-film surface of the beam-splitting element 611 with the light wave 130 further divided into light waves 131 and 132 through the second coated-film surface of the beam-splitting element 611. Nevertheless, the light wave 110 can be divided into three light waves 120, 131, and 132 just through one coated-film surface of the beam-splitting element 611.

Subsequently, the optical filtering element 612 arranged between the beam-splitting element 611 and the photo-detector 613 filters off part channels of the light wave 120 and then outputs the light wave 121, which is then received by the photo-detector 613 and transformed into an electrical signal 51. Also, the photo-detector 614 receives the light wave 131 and transforms it into an electrical signal 52.

On the other hand, the beam-splitting element 621 divides the light wave 132 into light waves 133 and 134 of equal energy. Subsequently, the light waves 133 and 134 are directed into the Fabry-Perot Etalon 622 arranged between the beam-splitting element 621 and the photo-detectors 623 and 624 to separate out two light waves having specific wavelength, which are received by the photo detectors 623 and 624 and transformed into electrical signals 53 and 54, respectively.

Then, the servo element 63 receives these electrical signals 51, 52, 53, and 54 to perform a signal processing. To be specific, the servo element 63 performs coarse-tuning and channel recognition of the light output by the tunable light source 10 on the basis of a voltage ratio of signal 51 to signal 52, and performs fine-tuning and servo control of the light output by the tunable light source 10 with an error signal being a voltage difference between signals 53 and 54. Alternatively, the voltage ratio of the difference between signals 53 and 54 to signal 52 can be taken as an error signal for fine-tuning and servo control of the light output by the tunable light source 10.

Figure 7A:
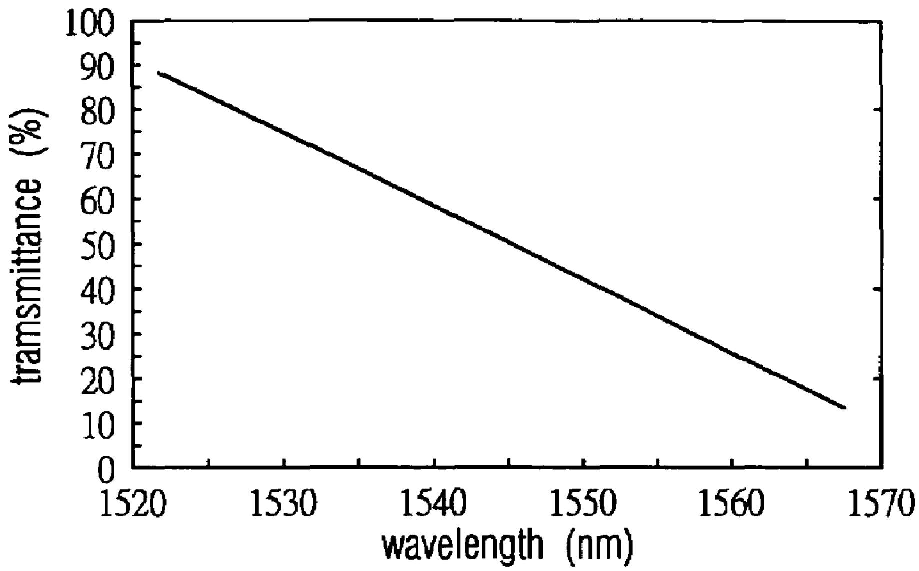
FIG. 7A is a spectrum diagram showing a relationship between wavelength and transmittance.
Figure 7B:
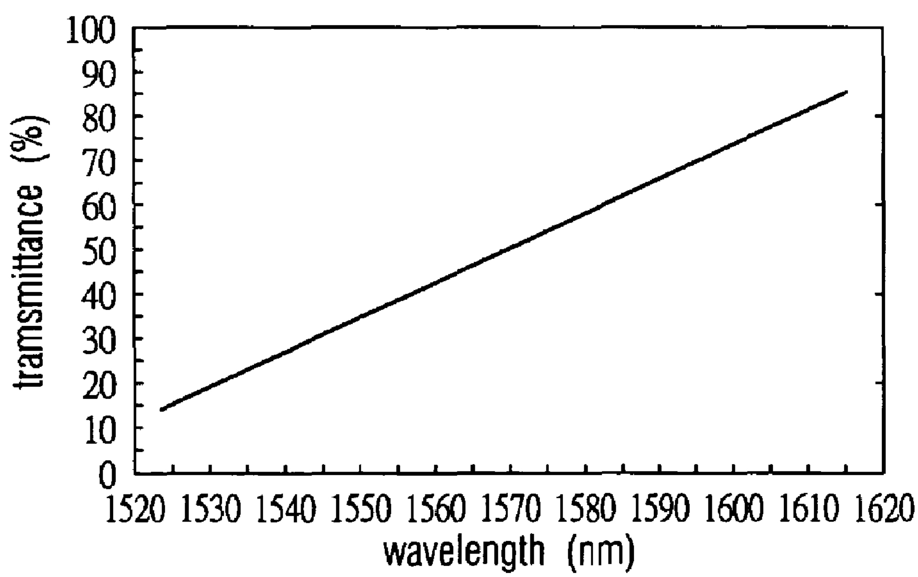
FIG. 7B is a spectrum diagram showing a relationship between wavelength and transmittance.

It is to be noted that the beam-splitting elements 611 and 621 in this embodiment can be such a device that divides a light into two lights of equal or unequal energy as beam splitter, prism, and polygon splitting prism. In addition, either the beam-splitting elements 611 and 621 can be a prism set composed of two optical prisms. Also, the relative curve of transmittance versus wavelength in the spectrum diagram of the light wave passing through the optical filtering element 612 has a nonzero slope such as that shown in FIGS. 7A and 7B. Therefore, a basis for coarse-tuning and channel recognition of the light with specific wavelength can be established according to the actual transmittance of the optical filtering element 612 and the spectrum shown in FIGS. 7A and 7B.

[The Second Embodiment]

Figure 3B:
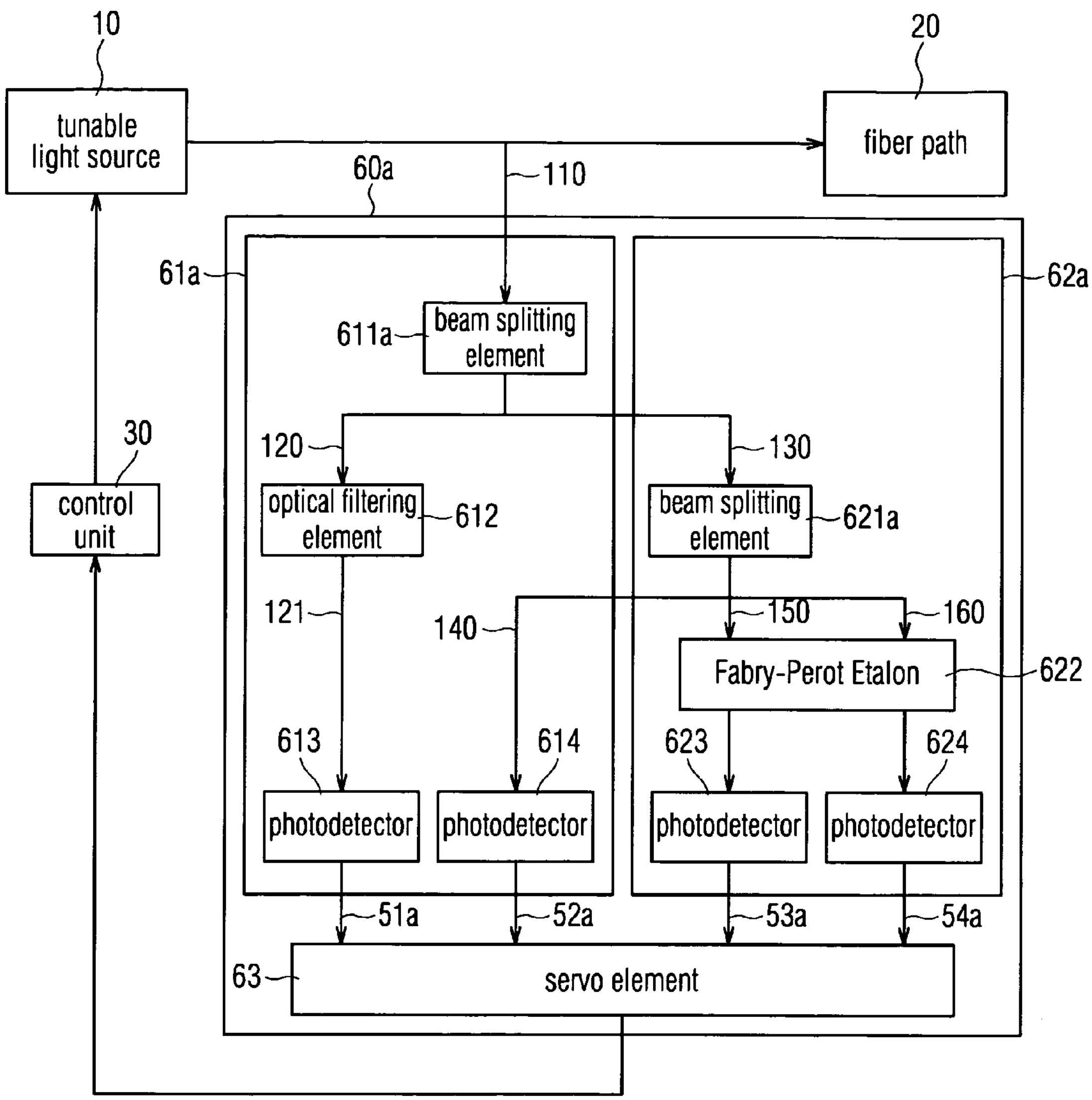
FIG. 3B is a schematic diagram showing an arrangement of the wavelength stabilizing apparatus according to second embodiment of the invention.

Referring to FIG. 3B, a wavelength stabilizing apparatus 60*a* for the tunable optical element in the optical communication system according to second embodiment of invention includes a coarse-tuning module 61*a*, a fine-tuning module 62*a*, and a servo element 63.

The coarse-tuning module 61*a* includes a beam-splitting element 611*a*, an optical filtering element 612, and two photo-detectors 613 and 614. All the elements are the same as those in the coarse-tuning module 61 according to the first embodiment except for the beam-splitting element 611*a*. On the other hand, the fine-tuning module 62*a* includes a beam-splitting element 621*a*, a Fabry-Perot Etalon 622, and two photo-detectors 623 and 624. All the elements are the same as those in the fine-tuning module 62 according to the first embodiment except for the beam-splitting element 612*a*.

In this embodiment, the beam-splitting element 611*a* performs a light beam splitting with just one coated-film surface thereof (not shown), and the beam-splitting element 621*a* performs a light beam splitting with at least one coated-film surface thereof (not shown).

The wavelength stabilizing control process according to this embodiment is described as follows.

First of all, a light wave 110 entering the beam-splitting element 611*a* is divided into light waves 120 and 130 through the coated-film surface of the beam-splitting element 611*a*.

After that, the light wave 120 is directed into the optical filtering element 612 arranged between the beam-splitting element 611*a* and the photo-detector 613 to filter off part channels thereof and output a light wave 121 to be received by the photo-detector 613 and transformed into an electrical signal 51*a*.

On the other hand, the light wave 130 is divided into light waves 140, 150, and 160 through the beam-splitting element 621*a* with at least one coated-film surface (not shown) thereof. Afterwards the light wave 140 is received directly by the photo-detector 614 and then transformed into an electrical signal 52*a*. The light waves 150 and 160 are directed into the Fabry-Perot Etalon 622 arranged between the beam-splitting element 621*a* and the photo-detectors 623 and 624 to separate out two light waves having specific wavelength, which are then received by the photo detectors 623 and 624 and further transformed into electrical signals 53*a* and 54*a*, respectively.

Next, the electrical signals 51*a*, 52*a*, 53*a*, and 54*a* are received by the servo element 63 to perform a signal processing. Specifically, the servo element 63 performs a coarse-tuning and channel recognition of the light output by the tunable source 10 on the basis of a voltage ratio of the electrical signal 51*a* to the electrical signal 52*a*, and performs a fine-tuning and servo control of the light output by the tunable source 10 with an error signal being a voltage difference between the electrical signals 53*a* and 54*a*. Alternatively, the servo element 63 can also perform a fine-tuning and servo control of the light output by the tunable source 10 with an error signal being a voltage ratio of the voltage difference between the electrical signals 53*a* and 54*a* to the electrical signal 52*a*.

It is to be noted that either the beam-splitting elements 611*a* and 621*a* in this embodiment can be such a device that divides a light wave into light waves of equal or unequal energy as beam splitter, polygon splitting prism, and a prism set composed of two optical prisms. Besides, the relative curve of transmittance versus wavelength in the spectrum diagram of the light wave passing through the optical filtering element 612 has a nonzero slope such as that shown in FIGS. 7A and 7B. Therefore, the coarse-tuning and channel recognition of the light having specific wavelength can be accomplished according to the actual transmittance of the light passing through the optical filtering element 612 and the spectrum shown in FIGS. 7A and 7B.

[The Third Embodiment]

Figure 3C:
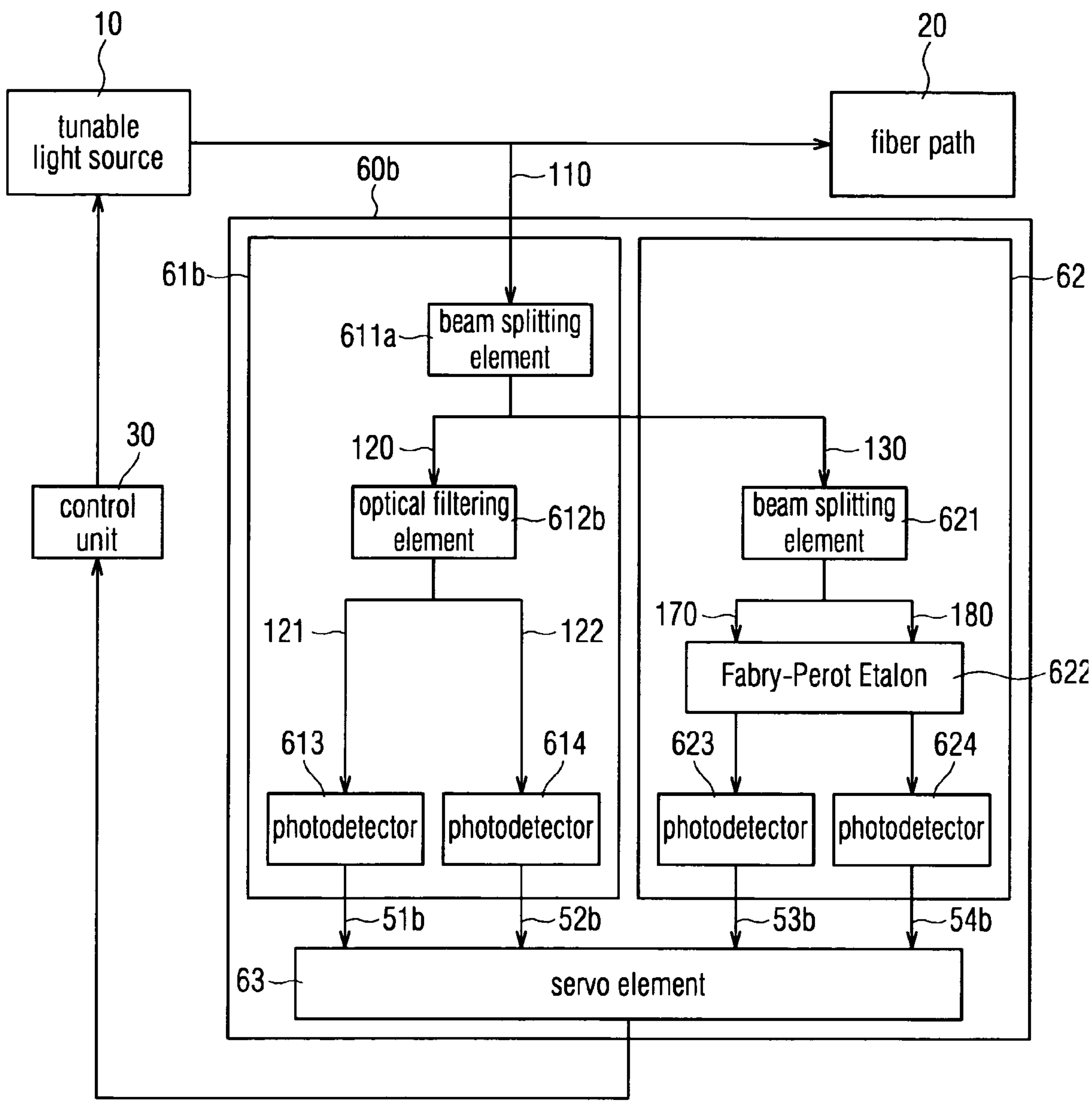
FIG. 3C is a schematic diagram showing an arrangement of the wavelength stabilizing apparatus according to third embodiment of the invention.

Referring to FIG. 3C, a wavelength stabilizing apparatus 60*b* for the tunable optical element in the optical communication system according to a third embodiment of invention includes a coarse-tuning module 61*b*, a fine-tuning module 62, and a servo element 63.

The coarse-tuning module 61*b* includes a beam-splitting element 611*a*, an optical filtering element 612*b*, and two photo-detectors 613 and 614. All the elements are the same as those in the coarse-tuning module 61 in the first embodiment except for the beam-splitting element 611*b* and optical filtering element 612*b*. On the other hand, the fine-tuning module 62 includes a beam-splitting element 621, a Fabry-Perot Etalon 622, and two photo-detectors 623 and 624, which are the same as those in the fine-tuning module 62 in the first embodiment.

In this embodiment, each of the beam-splitting elements 611*a* and 621 uses only one coated-film surface (not shown) to perform a light beam splitting.

The wavelength stabilizing control process according to this embodiment is described as follows.

First of all, a light wave 110 entering the beam-splitting element 611*a* is divided into light waves 120 and 130 through the coated-film surface of the beam-splitting element 611*a*.

After that, the light wave 120 is directed into the optical filtering element 612*b* to be further divided into light waves 121 and 122. Then, the light waves 121 and 122 are received by the photo-detectors 613 and 614, respectively, and transformed into electrical signals 51*b* and 52*b*, respectively.

On the other hand, the light wave 130 is divided into light waves 170 and 180 through the beam-splitting element 621. Subsequently, the light waves 170 and 180 are directed into the Fabry-Perot Etalon 62 arranged between the beam-splitting element 621 and the photo-detectors 623 and 624 to make two light waves having specific wavelength be separated out thereof, respectively. These two light waves are then received by the photo-detectors 623 and 624 and transformed into electrical signals 53*b* and 54*b*, respectively.

Next, the electrical signals 51*b*, 52*b*, 53*b*, and 54*b* are received by the servo element 63 to perform a signal processing. Specifically, the servo element 63 performs a coarse-tuning and channel recognition of the light output by the tunable light source 10 on the basis of either a voltage ratio of the electrical signal 51*b* to the voltage sum of the electrical signals 51*b* and 52*b* or a voltage ratio of the voltage difference between the electrical signal 51*b* and 52*b* to the voltage sum of the electrical signals 51*b* and 52*b*, and performs a fine-tuning and servo control of the light output by the tunable light source 10 with an error signal being a voltage difference between the electrical signals 53*b* and 54*b*. Alternatively, the servo element 63 can also perform a fine-tuning and servo control of the light output by the tunable light source 10 with an error signal being a voltage difference between the electrical signals 53*b* and 54*b* to the voltage sum of the electrical signals 51*b* and 52*b*.

It is to be noted that either the beam-splitting elements 611*a* and 621 in this embodiment can be such a device that divides the light wave into two light waves of equal or unequal energy as beam splitter, polygon beam-splitting prism, and prism set. Besides, the relative curve of transmittance versus wavelength in the spectrum diagram of the light wave passing through the optical filtering element 612*b* has a nonzero slope such as that shown in FIGS. 7A and 7B. Therefore, the coarse-tuning and channel recognition of the light with specific wavelength can be accomplished according to the actual transmittance of the light passing through the optical filtering element 612*b* and the spectrum shown in FIGS. 7A and 7B.

[The Fourth Embodiment]

Figure 3D:
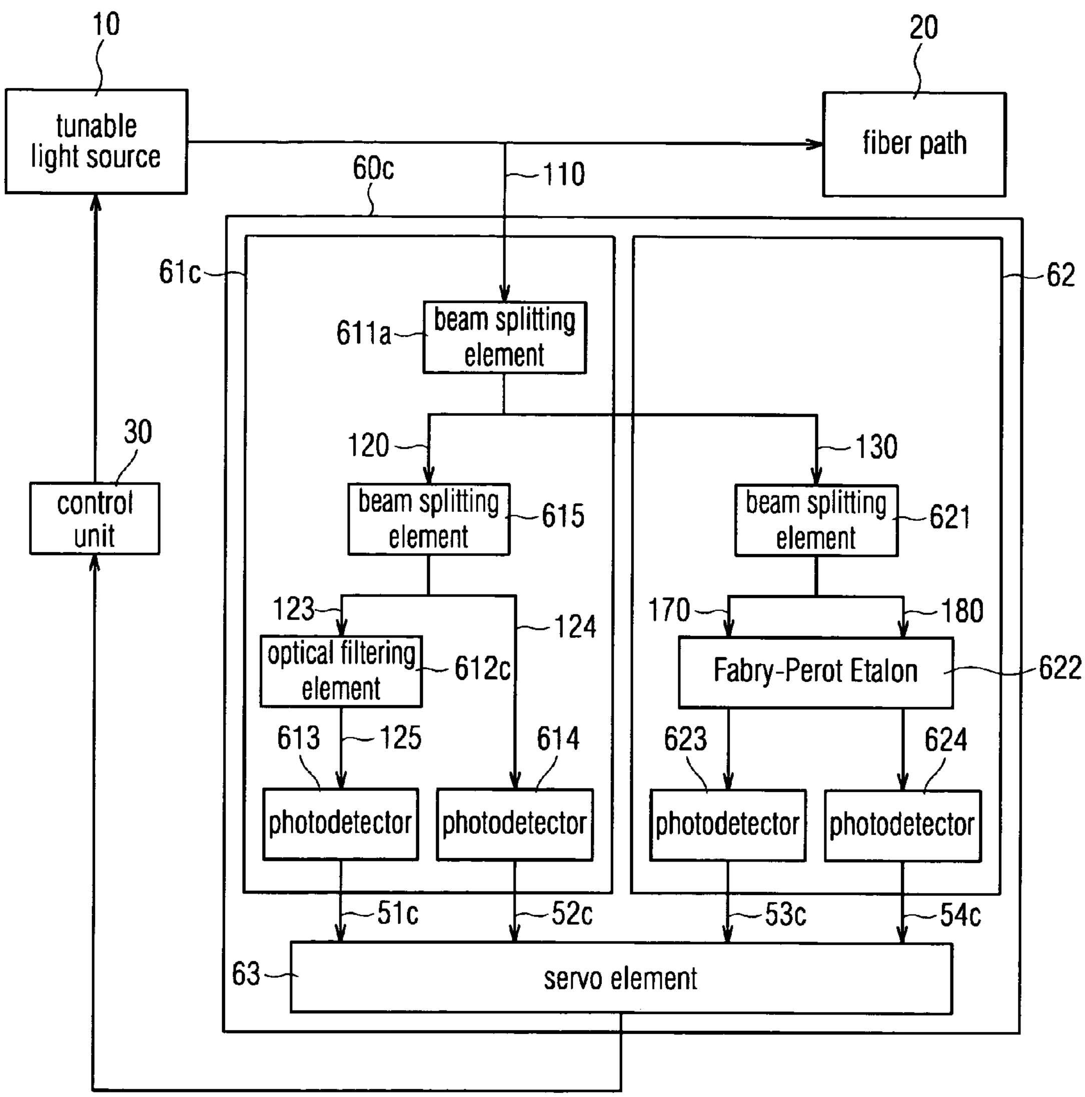
FIG. 3D is a schematic diagram showing an arrangement of the wavelength stabilizing apparatus according to fourth embodiment of the invention.

Referring to FIG. 3D, a wavelength stabilizing apparatus 60*c* used in the optical communication system for controlling the light wave output from the tunable optical element according to a fourth embodiment of the invention includes a coarse-tuning module 61*c*, a fine-tuning module 62, and a servo element 63.

The coarse-tuning module 61*c* includes two beam-splitting elements 611*a* and 615, an optical filtering element 612*c* and two photo-detectors 613 and 614. All the elements are the same as those in the coarse-tuning module 61 of the first embodiment except for the beam-splitting elements 611*a* and 615 and the optical filtering element 612*c*. On the other hand, the fine-tuning module 62 includes a beam-splitting element 621, a Fabry-Perot Etalon 622, two photo-detectors 623 and 624. All the elements are the same as those in the fine-tuning module 62 of the first embodiment.

In this embodiment, each of the beam-splitting elements 611*a*, 615, and 621 uses only one coated-film surface (not shown) thereof to perform the splitting.

The wavelength stabilizing process in this embodiment is described as follows.

First of all, the light wave 110 is divided into light waves 120 and 130 through the beam-splitting element 611*a*.

After that, on the one hand, the light wave 120 is divided into light waves 123 and 124 through the beam-splitting element 615. The light wave 123 is further directed into the optical filtering element 612*c* to make part channels of the light wave 123 be filtered off and obtain a light wave 125, which is then received by the photo-detector 613 and transformed into an electrical signal 51*c*. The light wave 124 is received by the photo-detector 614 and transformed into an electrical signal 52*c*.

On the other hand, the light wave 130 is divided into light waves 170 and 180 through the beam-splitting element 621. Subsequently, the light waves 170 and 180 are directed into the Fabry-Perot Etalon 622 arranged between the beam-splitting element 621 and the photo-detectors 623 and 624 to separate out two light waves having specific wavelength from the light waves 170 and 180, respectively. Then, the light waves having specific wavelength are received by the photo-detectors 623 and 624 and transformed into electrical signal 53*c* and 54*c*, respectively.

Next, the electrical signals 51*c*, 52*c*, 53*c*, and 54*c* are received by the servo element 63 to perform a signal processing.

Specifically, the servo element 63 performs coarse-tuning and channel recognition of the light output by the tunable source 10 on the basis of the voltage ratio of the electrical signal 51*c* to the electrical signal 52*c*, and performs fine-tuning and servo control of the light output by the tunable source 10 with an error signal being a voltage difference between the electrical signals 53*c* and 54*c*. Alternatively, the servo element 63 can also perform fine-tuning and servo control of the light output by the tunable source 10 with an error signal being a voltage ratio of the voltage difference between the electrical signals 53*c* and 54*c* to the electrical signal 52*c*.

It is to be noted that each of the beam-splitting elements 611*a*, 615, and 621 can be such a device that divides a light wave into two light waves of equal or unequal energy as beam splitter, prism set, and polygon splitting prism. Besides, the relative curve of transmittance versus wavelength in the spectrum diagram of the light wave passing through the optical filtering element 612*c* has a nonzero slope such as that shown in FIGS. 7A and 7B. Therefore, the coarse-tuning and channel recognition of the light having specific wavelength can be accomplished according to the actual transmittance of the light passing through the optical filtering element 612*c* and the spectrum shown in FIGS. 7A and 7B.

[The Fifth Embodiment]

Figure 4A:
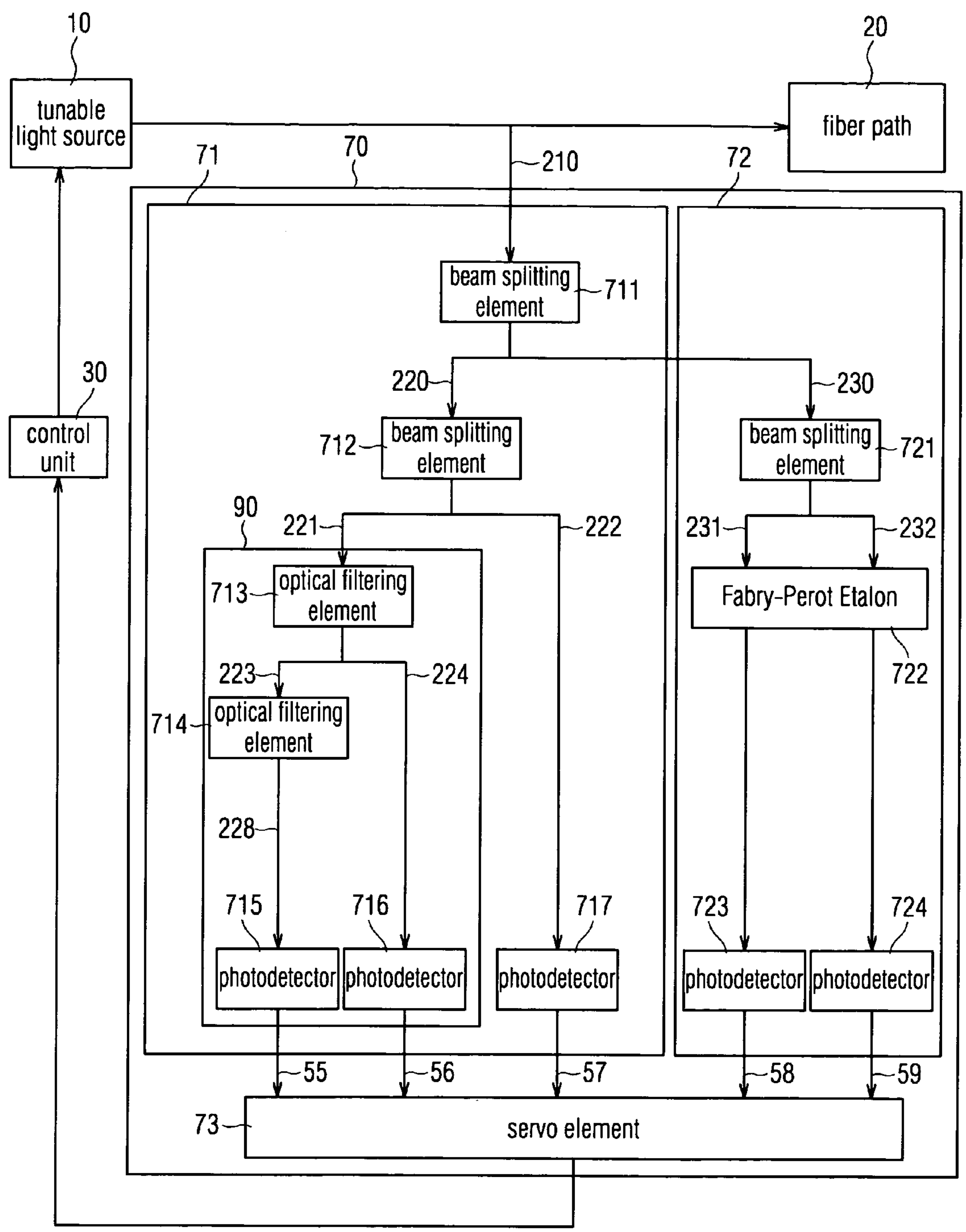
FIG. 4A is a schematic diagram showing an arrangement of the wavelength stabilizing apparatus according to fifth embodiment of the invention.

Referring to FIG. 4A, a wavelength stabilizing apparatus 70 used in the optical communication system according to a fifth embodiment of the invention includes a coarse-tuning module 71, a fine-tuning module 72, and a servo element 73. The wavelength stabilizing apparatus 70 receives one part of a light wave 210 output from the tunable laser source 10 to the fiber path 20, and tunes the light source 10 in cooperation with the servo element 73 and the control unit 30.

The coarse-tuning module 71 includes two beam-splitting elements 711 and 712, two optical filtering elements 713 and 714, and three photo-detectors 715, 716, and 717. On the other hand, the fine-tuning module 72 includes a beam-splitting element 721, a Fabry-Perot Etalon 722, and two photo-detectors 723 and 724. All the elements are the same as those of the fine-tuning module 62 in the first embodiment. Each of the beam-splitting elements 711, 712, and 721 has at least one coated-film surface (not shown) and uses only one coated-film surface to perform the splitting.

The wavelength stabilizing control process according to this embodiment is described as follows.

First of all, the light wave 210 is divided into light waves 220 and 230 by the beam-splitting element 711 through the coated-film surface thereof. After that, the light wave 220 is further divided into light waves 221 and 222 by the beam-splitting element 712 through the coated-film surface thereof, while the light wave 230 is further divided into light waves 231 and 232 through the coated-film surface thereof.

Then, the light wave 221 is divided into light waves 223 and 224 through the optical filtering element 713. The light wave 223 is then directed into the optical filtering element 714 to make part channels of the light wave 223 be filtered off and obtain a light wave 228, which is received by the photo-detector 715 and transformed into an electrical signal 55. The light wave 224 is received by the photo-detector 716 and transformed into an electrical signal 56. Besides, the light wave 222 is received by the photo-detector 717 and transformed into an electrical signal 57.

On the other hand, the light waves 231 and 232 are directed into the Fabry-Perot Etalon 722 arranged between the beam-splitting element 721 and the photo-detectors 723 and 724 to separate out two light wave having specific wavelength, which are then received by the photo-detectors 723 and 724 and transformed into electrical signals 58 and 59, respectively.

Next, the electrical signals 55, 56, 57, 58, and 59 are received by the servo element 73 to perform a signal processing. Specifically, the servo element 73 performs coarse-tuning and channel recognition of the light output by the tunable source 10 on the basis of a voltage ratio of the electrical signal 57 to the electrical signal 56 and a voltage ratio of the electrical signal 57 to the electrical signal 55, and performs fine-tuning and servo control with an error signal being a voltage difference between the electrical signals 58 and 59. Alternatively, the servo element 73 can also perform fine-tuning and servo control of the light output by the tunable source 10 with an error signal being a voltage ratio of the voltage difference between the electrical signals 58 and 59 to electrical signal 57.

Figure 8A:
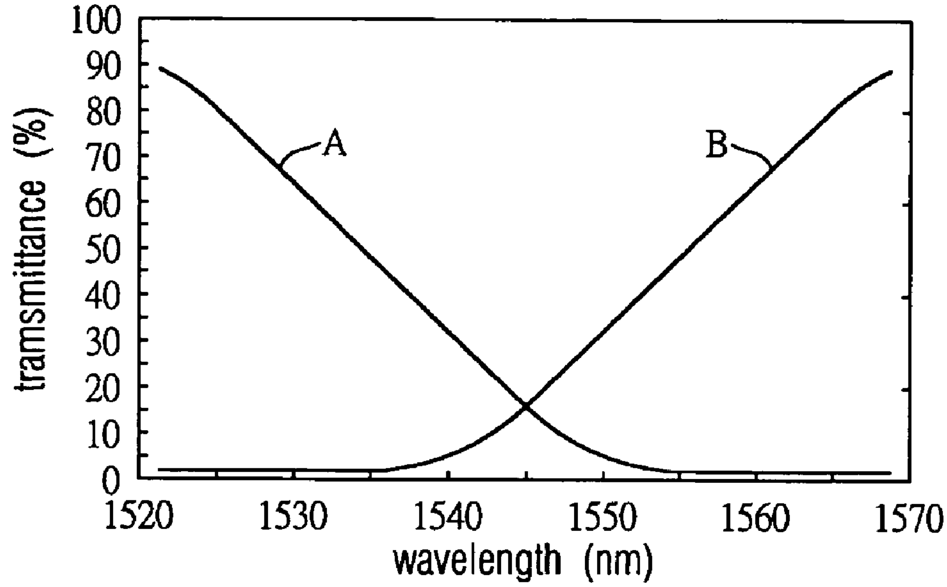
FIG. 8A is a spectrum diagram showing a relationship between wavelength and transmittance.
Figure 8B:
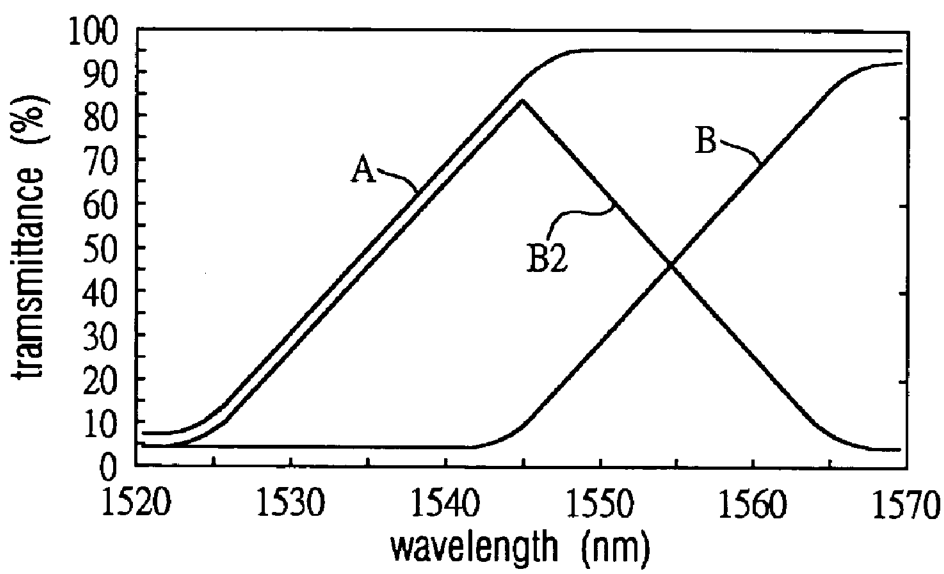
FIG. 8B is a spectrum diagram showing a relationship between wavelength and transmittance.

The relative curve of transmittance versus wavelength in the spectrum diagram of the light wave passing through the optical filtering elements 713 and 714 has a nonzero slope as curves A and B shown in FIGS. 8A and 8B, respectively. Besides, the beam-splitting elements 711, 712, and 721 are selected from a group composed of beam splitter, prism, and prism set, such as polygon splitting prism for example, and capable of dividing a light wave into two light waves of equal or unequal energy.

The coarse-tuning module 71 in this embodiment is used to increase the transmittance so as to raise the wavelength recognition resolution in the circumstances that the slope of the relative curves with respect to wavelength and transmittance of the optical filtering elements 612, 612*b*, and 612*c* in the above embodiments is not large enough.

Figure 8C:
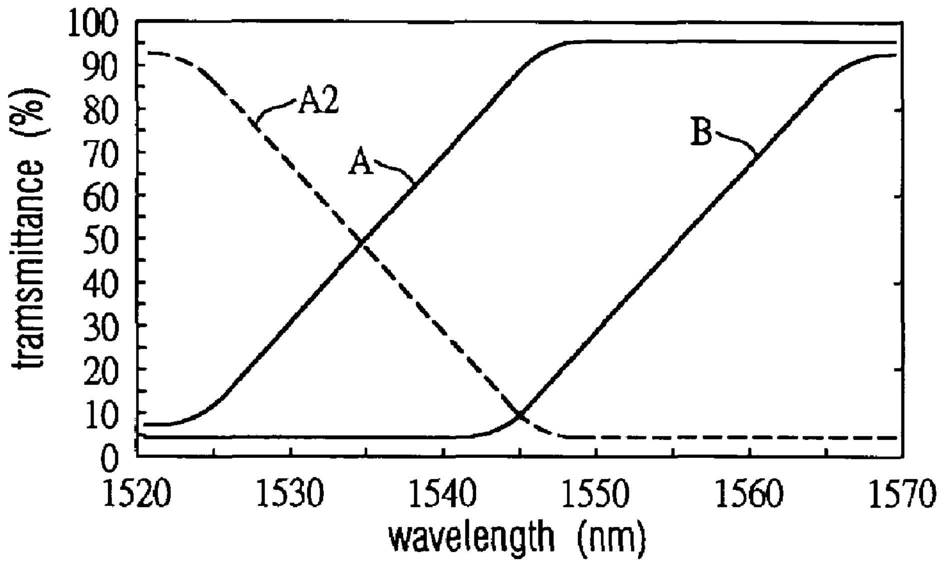
FIG. 8C is a spectrum diagram showing a relationship between wavelength and transmittance.

In other words, the optical filtering element 713 can be modified so that the relative curve with respect to wavelength and transmittance can have a steeper slope as that of curve A shown in FIG. 8A or curve A2 shown in FIG. 8C. In the meantime, the light wave 223 is filtered by the optical filtering element 714 that has optical characteristics corresponding to the curve B in FIG. 8A or curve B in FIG. 8C, which are plotted according to the voltage ratio of the electrical signal 55 to the electrical signal 57, to maintain the applicable range of wavelength but increase the voltage potential with the slope so that the object of increasing the wavelength resolution can be achieved. In additional, the processes drafted in the block 90 can be repeated to further increase the wavelength resolution.

In this embodiment, the optical filtering element 714 and the photo-detector 715 can be leaved out in use, so that the servo element 73 performs coarse-tuning and channel recognition just on the basis of the voltage ratio of the electrical signal 57 to electrical signal 56.

[The Sixth Embodiment]

Figure 4B:
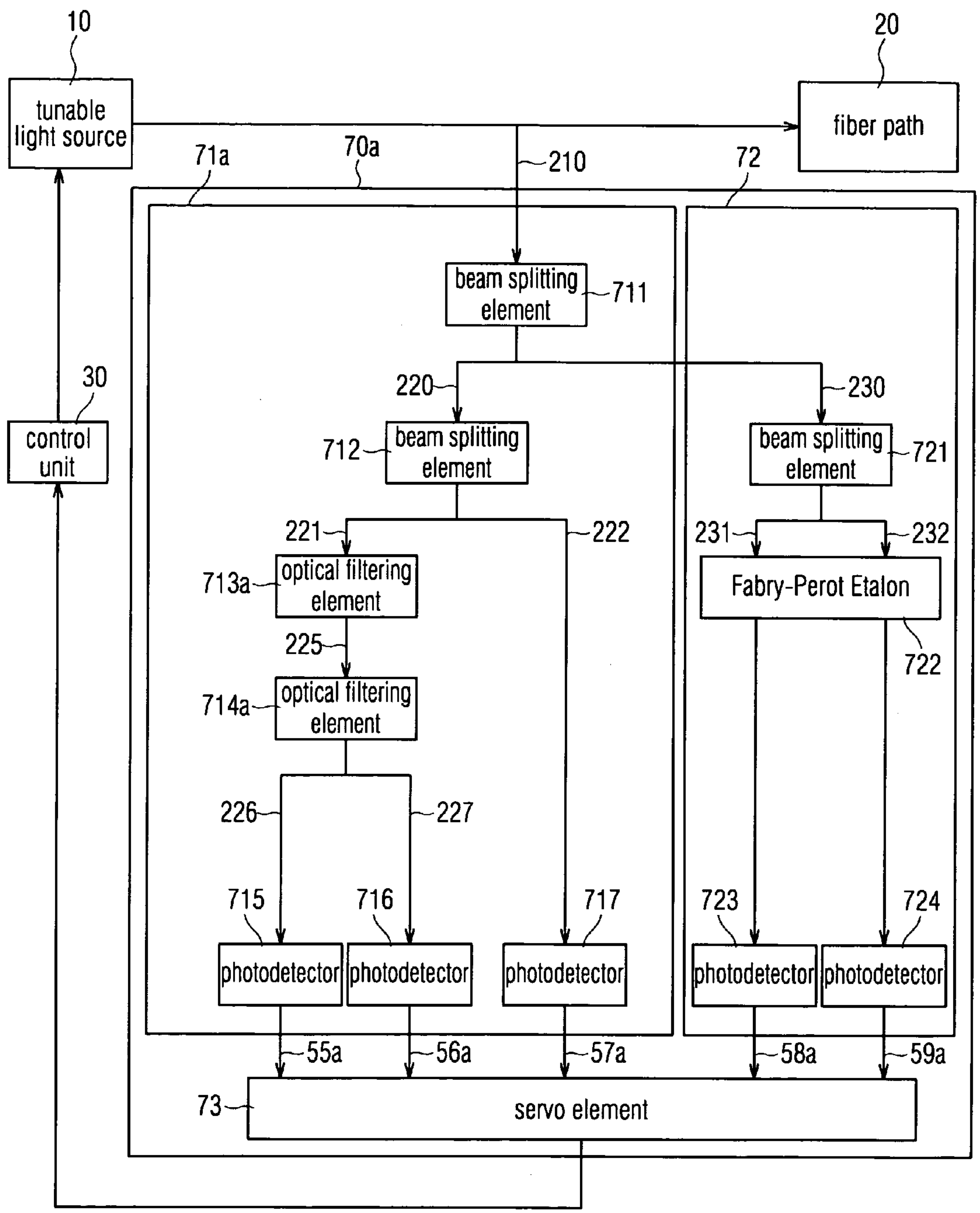
FIG. 4B is a schematic diagram showing an arrangement of the wavelength stabilizing apparatus according to sixth embodiment of the invention.

The wavelength stabilizing apparatus 70*a* used in the optical communication system according to a sixth embodiment of the invention is shown in FIG. 4B. In this embodiment, the fine-tuning module 72 is the same as that in the fifth embodiment, and the elements included in the coarse-tuning module 71*a* are those in the fifth embodiment except for the arrangements.

The wavelength stabilizing control process is described as follows.

First of all, the light wave 210 entering beam-splitting element 711 is divided into light waves 220 and 230 through the coated-film surface of the beam-splitting element 711.

After that, the light wave 220 is divided into light waves 221 and 222 through the beam-splitting element 712. The light wave 221 is directed into the optical filtering element 713*a* to filter part channels of thereof off to become light wave 225. The light wave 225 is further divided into light waves 226 and 227 through the optical filtering element 714*a*. The light waves 226 and 227 are received by the photo-detectors 715 and 716 and transformed into electrical signals 55*a* and 56*a*, respectively. The light wave 222 is received by the photo-detector 717 and transformed into an electrical signal 57*a*.

On the other hand, the light wave 230 is divided into light waves 231 and 232 of equal energy by the beam-splitting element 721. The light waves 231 and 232 are directed into the Fabry-Perot Etalon 722 arranged between the beam-splitting element 721 and the photo-detectors 723 and 724 to separate two light waves having specific wavelength out of the light waves 231 and 232, which are received by the photo-detectors 723 and 724 and transformed into electrical signals 58*a* and 59*a*, respectively.

Next, the electrical signals 55*a*, 56*a*, 57*a*, 58*a*, and 59*a* are received by the servo element 73 to perform a signal processing. To be specific, the servo element 73 performs coarse-tuning and channel recognition of the light output from the optical tunable element on the basis of a voltage ratio of the electrical signal 57*a* to the electrical signal 56*a* or *a* voltage ratio of the electrical signal 57*a* to the electrical signal 55*a*, and performs fine-tuning and servo control of the light output from the optical tunable element with an error signal being the voltage difference between the electrical signal 58*a* and the electrical signal 59*a*. Alternatively, the servo element 73 can also perform fine-tuning and servo control of the light output from the optical tunable element with an error signal being a voltage ratio of the voltage difference between the electrical signals 58*a* and 59*a* to the electrical signal 57*a* in order to further diminish the effect of the energy variation of the input light.

Figure 8D:
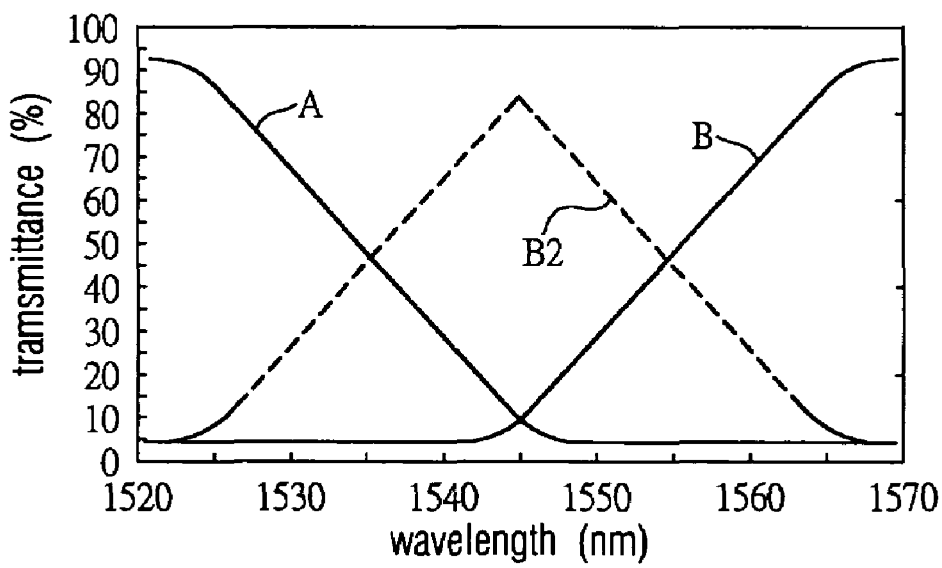
FIG. 8D is a spectrum diagram showing a relationship between wavelength and transmittance.

In this embodiment, the relative curve of transmittance versus wavelength in the spectrum diagram of the light wave passing through the optical filtering elements 713*a* and 714*a* has a nonzero slope such as that of curve A and B shown in FIGS. 8B and 8D, respectively. Therefore, the voltage ratio of the electrical signal 56*a* to the electrical signal 57*a* can be represented by the curve B2 in FIG. 8B or 8D. The voltage ratio of the electrical signal 55*a* to the electrical signal 57*a* can be represented by the curve B in FIG. 8B or 8D.

[The Seventh Embodiment]

Figure 5:
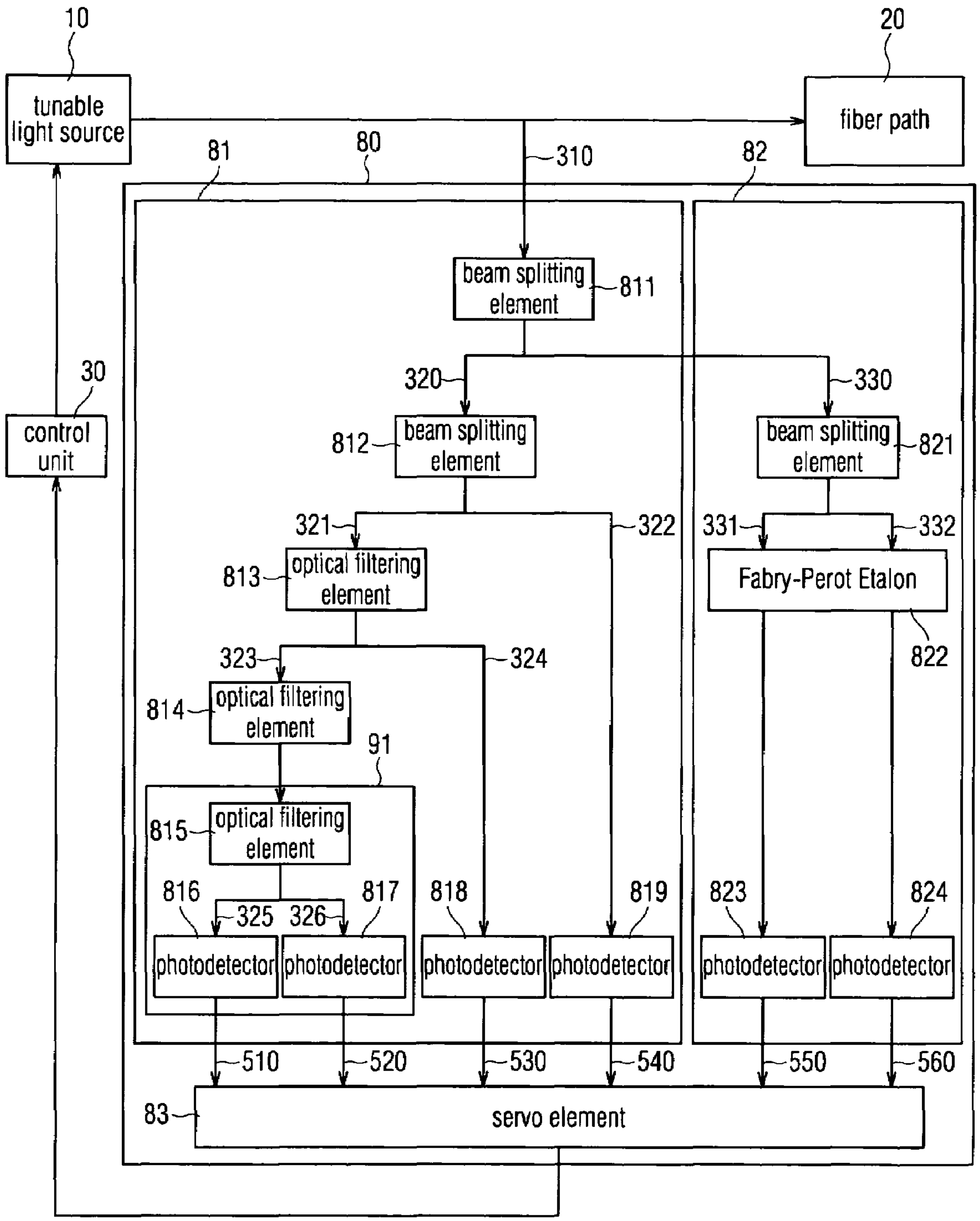
FIG. 5 is a schematic diagram showing an arrangement of the wavelength stabilizing apparatus according to seventh embodiment of the invention.

Referring to FIG. 5, a wavelength stabilizing apparatus 80 used in the optical communication system to control a light wave output from light source 10 includes a coarse-tuning module 81, a fine-tuning module 82, and a servo element 83. The wavelength stabilizing apparatus 80 receives a part 310 of the light wave output from the tunable light source 10 to the fiber path 20, and then servo-controls the light wave 310 in cooperation with the control unit 30 to tune the light source 10.

The coarse-tuning module 81 includes two beam-splitting elements 811 and 812, three optical filtering elements 813, 814, and 815, and four photo-detectors 816, 817, 818, and 819. Each of the beam-splitting elements 811 and 812 is provided with at least one coated-film surface (not shown). On the other hand, the fine-tuning module 82 includes a beam-splitting element 821, a Fabry-Perot Etalon 822, and two photo-detectors 823 and 824, which are arranged as those described in the first embodiment.

The wavelength stabilizing process according to this embodiment is described as follows.

First of all, the light wave 310 entering the beam-splitting element 811 is divided into light waves 320 and 330 through a coated-film surface of the beam-splitting element 811.

After that, the light wave 320 is divided into light waves 321 and 322 through the beam-splitting element 812. The light wave 321 is further divided into light waves 323 and 324 by the optical filtering element 813. The light wave 323 is then directed into the optical filtering element 814 to filter off part channels thereof and further directed into the optical filtering element 815 to be divided into light waves 325 and 326. Each of the light waves 322 and 324 are received by the photo-detectors 819 and 818 and transformed into electrical signals 540 and 530, respectively. The light waves 325 and 326 are received by the photo-detectors 816 and 817 and transformed into electrical signals 510 and 520, respectively.

On the other hand, the light wave 330 is divided into light waves 331 and 332 of equal energy by the beam-splitting element 821. Subsequently, the light waves 331 and 332 are directed into the Fabry-Perot Etalon 822 arranged between the beam-splitting element 821 and the photo-detectors 823 and 824 to separate out light waves having specific wavelength. The light waves having specific wavelength are then received by the photo-detectors 823 and 824 and transformed into electrical signals 550 and 560, respectively.

Next, the electrical signals 550, 560, 540, 530, 520, and 510 are received by the servo element 83 to perform a signal processing. Specifically, the servo element 83 performs coarse-tuning and channel recognition of the light output from the optical tunable light source 10 on the basis of a voltage ratio of the electrical signal 540 to the electrical signal 530, or a voltage ratio of the electrical signal 540 to the electrical signal 520, or a voltage ratio of the electrical signal 540 to the electrical signal 510, and performs fine-tuning and servo control of the light output from the optical tunable light source 10 with an error signal being a voltage difference between the electrical signal 550 and the electrical signal 560.

Figure 9A:
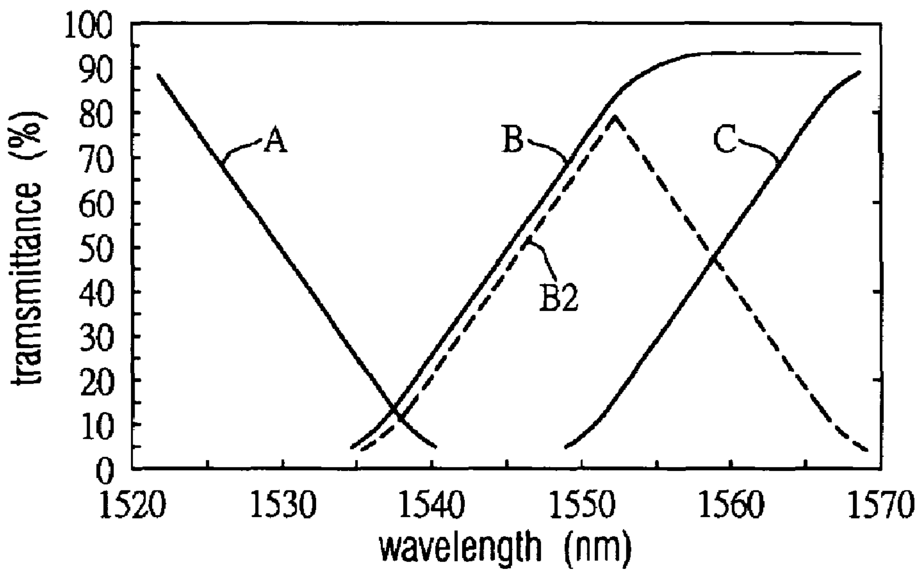
FIG. 9A is a spectrum diagram showing a relationship between wavelength and transmittance.

In this embodiment, the relative curve of transmittance versus wavelength in the spectrum diagram of the light wave passing through each of the optical filtering elements 813, 814, and 815 has a nonzero slope as that of curve A, B, and C shown in FIG. 9A.

For the purpose of increasing the wavelength analysis resolution, the electrical signals 510, 520, 530, and 540 are served as basis for coarse-tuning and channel recognition. For example, the voltage ratio of the electrical signal 530 to the electrical signal 540 is represented by the curve A in FIG. 9A, the voltage ratio of the electrical signal 520 to the electrical signal 540 is represented by the curve B2 in FIG. 9A, and the voltage ratio of the electrical signal 510 to the electrical signal 540 is represented by the curve C in FIG. 9A. Thereby, the applicable wavelength range can be remained constant while the voltage is varied with the slope, and thus the resolution of wavelength analysis can be increased. Moreover, the process defined within the block 91 is repeatable, and can be used to improve the wavelength analysis resolution.

[The Eighth Embodiment]

Figure 6:
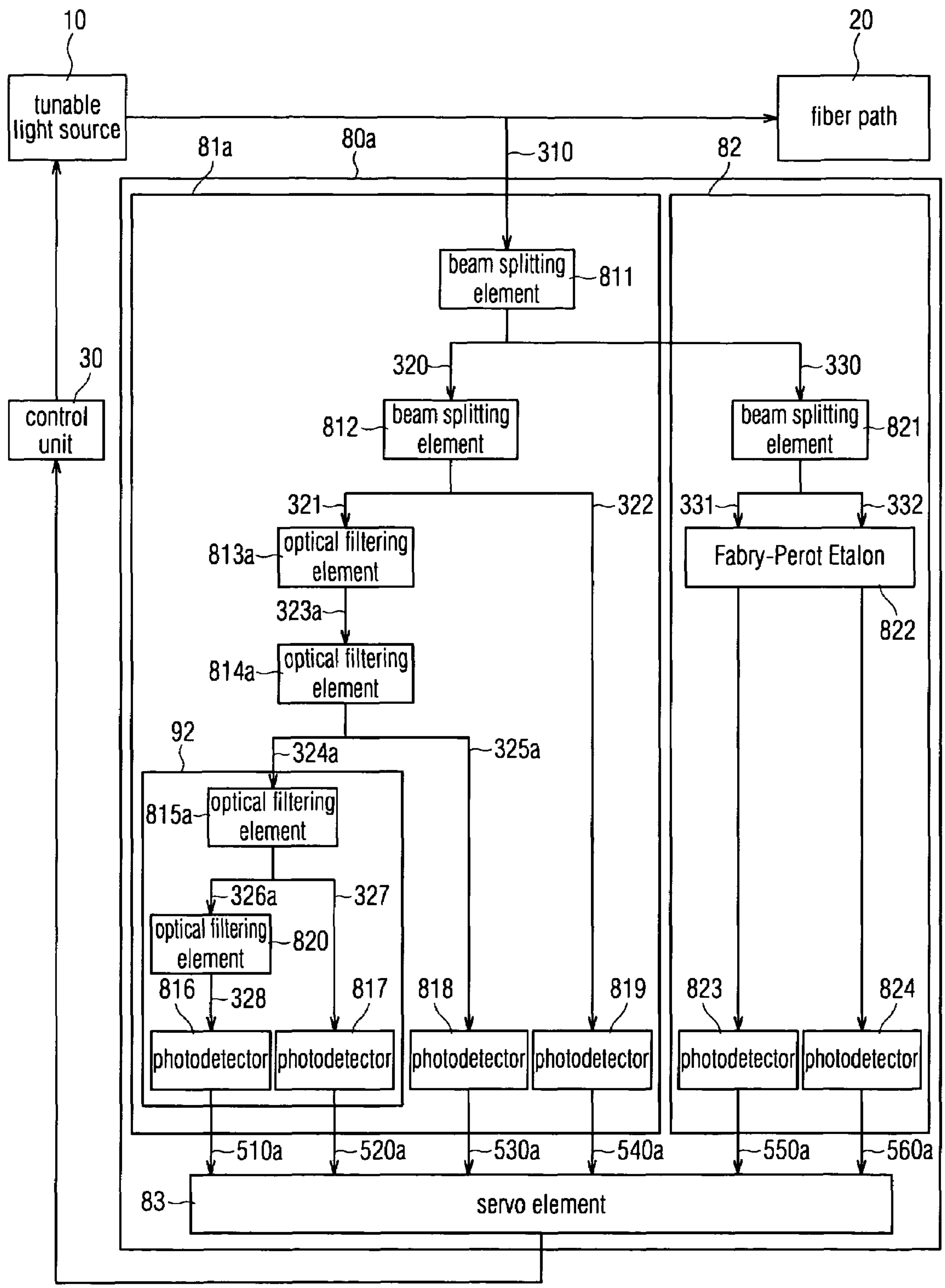
FIG. 6 is a schematic diagram showing an arrangement of the wavelength stabilizing apparatus according to eighth embodiment of the invention.

Referring to FIG. 6, a wavelength stabilizing apparatus 80*a* used in the optical communication system to control the light wave output by the tunable light source according to a eighth embodiment of the invention includes a coarse-tuning module 81*a*, a fine-tuning module 82, and a servo element 83.

The coarse-tuning module 81*a* includes two beam-splitting elements 811 and 812, four optical filtering elements 813*a*, 814*a*, 815*a*, and 820, and four photo-detectors 816, 817, 818, and 819. All the elements are the same as those in the coarse-tuning module according to the seventh embodiment except for the optical filtering elements 813*a*, 814*a*, and 820.

The wavelength stabilizing control process according to the invention is described as follows.

First of all, the light wave 310 entering the beam-splitting element 811 is divided into light waves 320 and 330 through a coated-film surface of the beam-splitting element 811.

After that, the light wave 320 is further divided into light waves 321 and 322 through the beam-splitting element 812. The light wave 321 is directed into the optical filtering element 813*a* to filter off part channels thereof to obtain a light wave 323*a*, which is divided into light waves 324*a* and 325*a* through the optical filtering element 814*a*. The light wave 324*a* is divided into light waves 326*a* and 327 through the optical filtering element 815*a*. The light wave 326*a* is directed into the optical filtering element 820 to filter off part channels thereof to obtain a light wave 328. These light waves 328, 327, 325*a*, and 322 are received by the photo-detectors 816, 817, 818, and 819, respectively, and transformed into electrical signals 510*a*, 520*a*, 530*a*, and 540*a*, respectively.

On the other hand, the light wave 330 is divided into light waves 331 and 332 of equal energy through the beam-splitting element 821. Afterwards the light waves 331 and 332 are directed into the Fabry-Perot Etalon 822 arranged between the beam-splitting element 821 and the photo-detectors 823 and 824 to separate out two light waves having specific wavelength. The light waves having specific wavelength are then received by the photo-detectors 823 and 824 and transformed into electrical signals 550*a* and 560*a*, respectively.

Next, the electrical signals 550*a*, 560*a*, 540*a*, 530*a*, 520*a*, and 510*a* are received by the servo element 83 to perform a signal processing. The servo element 83 performs coarse-tuning and channel recognition of the light wave output from the tunable light source 10 on the basis of a voltage ratio of the electrical signal 540*a* to the electrical signal 530*a*, or a voltage ratio of the electrical signal 540*a* to the electrical signal 520*a*, or a voltage ratio of the electrical signal 540*a* to the electrical signal 510*a*, and performs fine-tuning and channel recognition of the light wave output from the tunable light source 10 with an error signal being the voltage difference between the electrical signal 550*a* and the electrical signal 560*a*.

Figure 9B:
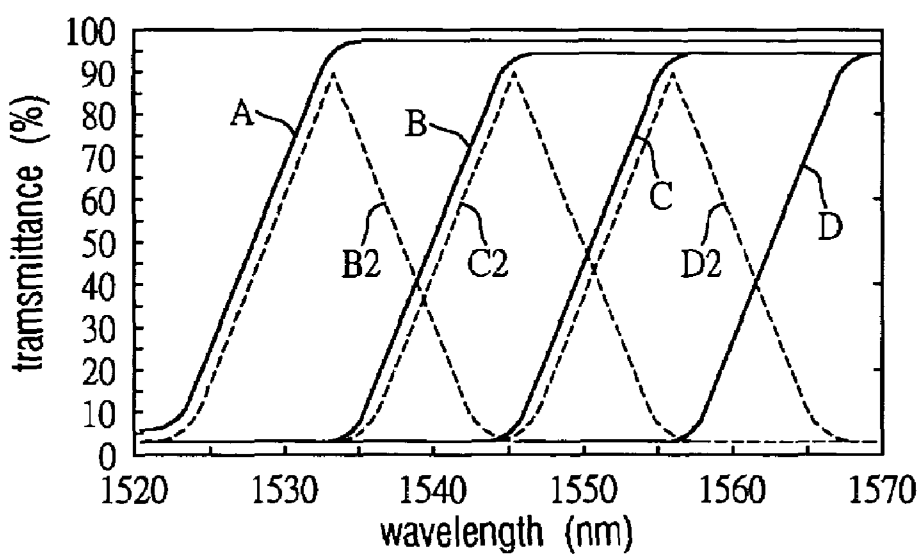
FIG. 9B is a spectrum diagram showing a relationship between wavelength and transmittance.

In this embodiment, the relative curve of transmittance versus wavelength in the spectrum diagram of the light wave passing through each of the optical filtering elements 813*a*, 814*a*, 815*a*, and 820 has a nonzero slope such as that of curves A, B, C, and D shown in FIG. 9B, respectively. In addition, the voltage ratio of the electrical signal 530*a* to the electrical signal 540*a* versus wavelength can be plotted as the curve B2 in FIG. 9B. The voltage ratio of the electrical signal 520*a* to the electrical signal 540*a* versus wavelength can be plotted as the curve C2 in FIG. 9B. The voltage ratio of the electrical signal 510*a* to the electrical signal 540*a* versus wavelength can be plotted as the curve D2 in FIG. 9B. As such, the electrical signals 540*a*, 530*a*, 520*a*, and 510*a* are served as basis for coarse-tuning and channel recognition, and the voltage difference between the electrical signal 550*a* and the electrical signal 560*a* is served as an error signal for fine-tuning and servo control. Similarly, the processes defined in the block 92 are repeatable and used to promote the wavelength analysis resolution.

One should note that the relative curve of transmittance versus wavelength in the spectrum diagram of each optical filtering element in the above embodiments has a nonzero slope, such as an optical filter with positive or negative slope, a high pass filter, and a low pass filter. In addition, any other kinds of optical filtering element can be used as long as the light wave having specific wavelength can be filtered out.

Figure 10:
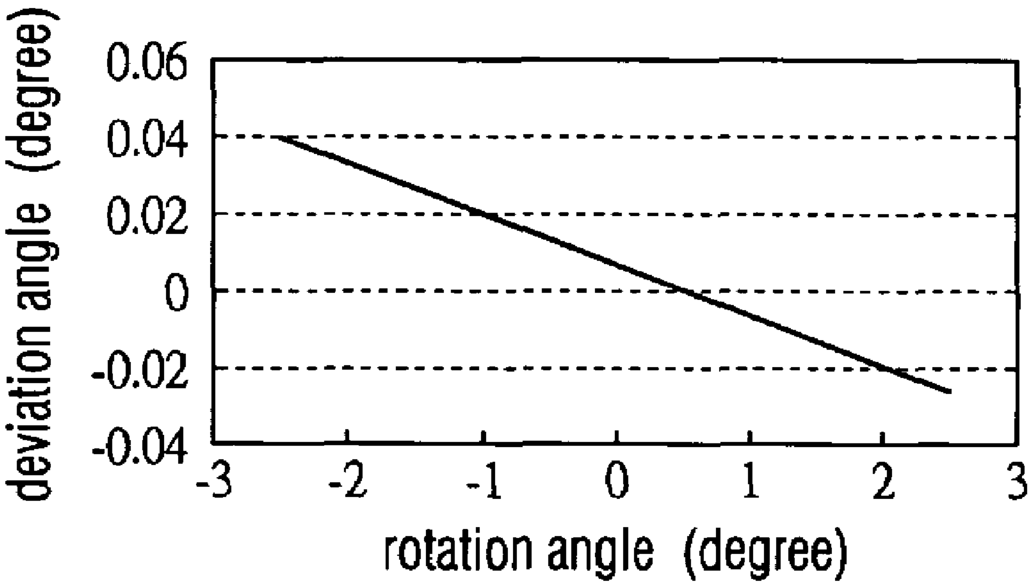
FIG. 10 is a diagram showing a relationship between rotational angle of a beam-splitting element and the emergence angle deviation of exit light.
Figure 11A:
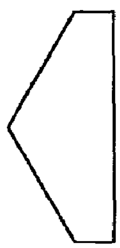
FIGS. 11A to 11I are top views of the shape of a prism used in the invention.
Figure 11B:
Figure 11C:
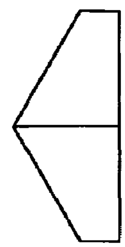
Figure 11D:
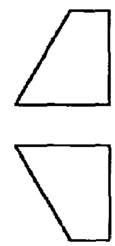
Figure 11E:
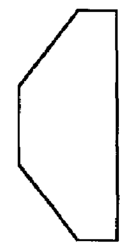
Figure 11F:
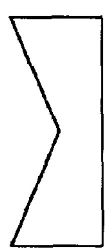
Figure 11G:
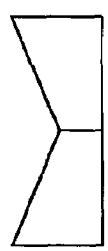
Figure 11H:
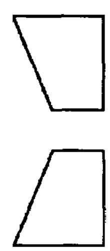
Figure 11I:
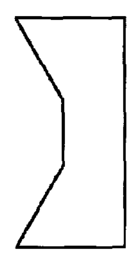

Besides, in the above embodiments, selecting a prism as the beam-splitting element in the fine-tuning module can diminish the position arrangement error in the manufacturing such as that induced by thermal expansion or the other effects. Referring to FIG. 10 as an example, when the prism rotates 1 degree as a result of thermal expansion or other effects, the deviation of the angles between the two emitting lights will be −0.012 degree around, which is reduced by 80 times. In addition, the prisms used in the invention can have a shape with a top view such as that shown in FIG. 11A to FIG. 11I. Also, a prism set or diffraction elements in addition to the above prisms can be used as the beam-splitting element.

Figure 12:
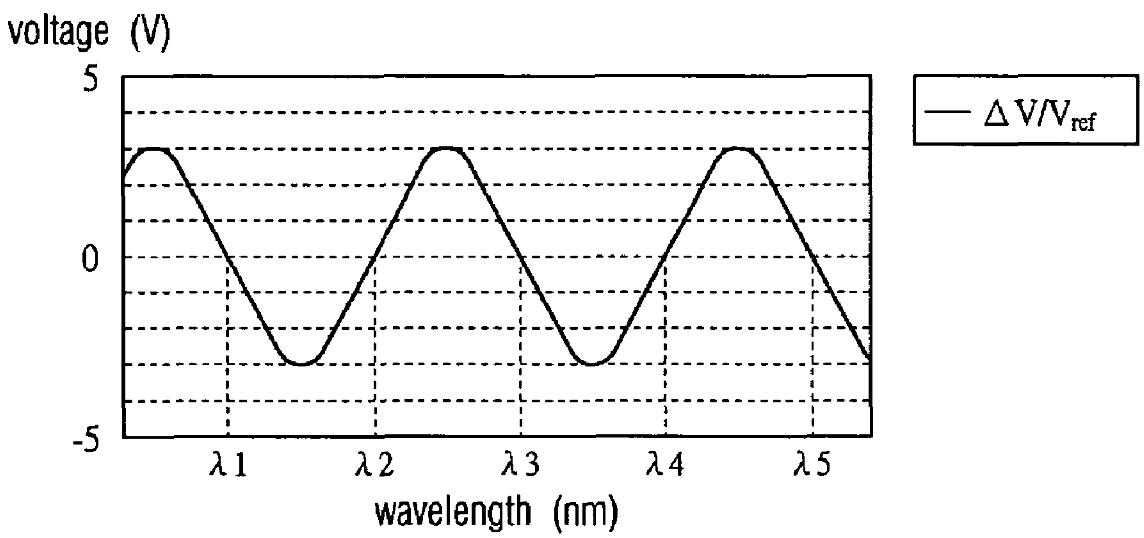
FIG. 12 is a spectrum diagram showing a relationship between wavelength and a ratio of the response voltage difference to the response voltage of the incident light wave.

On the other hand, the Fabry-Perot Etalon with an inclined angle is arranged to vary the refraction angles of the different incident light waves to further produce distinct optical path and lead to transmittance distinction so that the difference between the response voltage ΔV can be served as an error signal for servo control to accurately output a light wave with specific wavelength on a right channel. After that, the voltage ratio of the difference between the response voltage ΔV to the response voltage $V_f$ of the light wave of the incident light wave into the Fabry-Perot Etalon can be employed to diminish the energy variation of the input light, as shown in FIG. 12.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wavelength stabilizing apparatus used in an optical module for controlling a light wave output from a tunable optical element comprising:

a coarse-tuning module comprising:

a first beam-splitting element receiving and dividing the light wave into a plurality of light waves;

a first optical filtering element receiving at least one of the plurality of light waves and filtering off part channels of the light waves; and two photo-detecting elements transforming the light waves into a first electrical signal and a second electrical signal, respectively;

a fine-tuning module comprising:

a beam-splitting element dividing a received light wave into a plurality of light waves;

a Fabry-Perot Etalon separating light waves having specific wavelength out of the plurality of light waves from the beam-splitting element; and two photo-detecting elements receiving the light waves having specific wavelength and transforming them into a third electrical signal and a fourth electrical signal, respectively; and a servo element receiving the first, second, third, and fourth electrical signals to perform a signal processing;

wherein the servo element performs coarse-tuning and channel recognition of the light wave output from the tunable optical element on the basis of a voltage value relating to the first and second electrical signals, and performs fine-tuning and servo control of the light wave output from the tunable optical element with an error signal being a voltage value relating to the third and fourth electrical signals.

2. The wavelength stabilizing apparatus set forth according to claim 1, wherein the relative curve with respect to wavelength and transmittance of the first optical filtering element has a nonzero slope.

3. The wavelength stabilizing apparatus set forth according to claim 1, wherein the first beam-splitting element in the coarse-tuning module is provided with a first coated-film surface and a second coated-film surface.

4. The wavelength stabilizing apparatus set forth according to claim 1, wherein the beam-splitting element in the fine-tuning module is a polygon beam-splitting prism.

5. The wavelength stabilizing apparatus set forth according to claim 1, wherein the first optical filtering element is a high pass edge filter.

6. The wavelength stabilizing apparatus set forth according to claim 1, wherein the first optical filtering element is provided between the first beam-splitting element and one of the photo-detecting elements of the coarse-tuning module.

7. The wavelength stabilizing apparatus set forth according to claim 1, wherein the first optical filtering element is provided between the first beam-splitting element and the photo-detecting elements of the coarse-tuning module.

8. The wavelength stabilizing apparatus set forth according to claim 1, wherein the coarse-tuning module further comprises a second beam-splitting element provided between the first beam-splitting element and the first optical filtering element.

9. The wavelength stabilizing apparatus set forth according to claim 8, wherein the second beam-splitting element is provided with a coated-film surface.

10. The wavelength stabilizing apparatus set forth according to claim 8, wherein the coarse-tuning module further comprises a second optical filtering element provided between the first optical filtering element and one of the photo-detecting elements of the coarse-tuning module, and a first photo-detecting element receiving directly the light wave from the second beam-splitting element.

11. The wavelength stabilizing apparatus set forth according to claim 8, wherein the coarse-tuning module further comprises a second optical filtering element provided between the first optical filtering element and the photo-detecting elements of the coarse-tuning module, and a first photo-detecting element receiving directly the light wave from the second beam-splitting element.

12. The wavelength stabilizing apparatus set forth according to claim 10, wherein a relative curve with respect to wavelength and transmittance of the second optical filtering element has a nonzero slope.

13. The wavelength stabilizing apparatus set forth according to claim 11, wherein a relative curve with respect to wavelength and transmittance of the second optical filtering element has a nonzero slope.

14. The wavelength stabilizing apparatus set forth according to claim 10, wherein the coarse-tuning module further comprises a third optical filtering element provided between the second optical filtering element and the photo-detecting elements of the coarse-tuning module, and a second photo-detecting element receiving directly the light wave from the first optical filtering element.

15. The wavelength stabilizing apparatus set forth according to claim 11, wherein the coarse-tuning module further comprises a third optical filtering element provided between the second filtering element and one of the photo-detecting elements of the coarse-tuning module, a fourth optical filtering element provided between the second optical filtering element and the first optical filtering element, and a second photo-detecting element receiving directly the light wave from the fourth optical filtering element.

16. The wavelength stabilizing apparatus set forth according to claim 14, wherein a relative curve with respect to wavelength and transmittance of the third optical filtering element has a nonzero slope.

17. The wavelength stabilizing apparatus set forth according to claim 15, wherein a relative curve with respect to wavelength and transmittance of the third optical filtering element and the fourth optical filtering element each has a nonzero slope.

18. A wavelength stabilizing control method used in an optical module for controlling a light wave output from a tunable optical element comprising:

a step of inputting the light wave into a coarse-tuning module and a fine-tuning module;

a step of transforming the light wave output from the coarse-tuning module and the fine-tuning module into at least first, second, third and fourth electronic signals; and a step of performing a signal processing with the electronic signals;

wherein the electronic signals transformed from the coarse-tuning module are taken as basis for coarse-tuning and channel recognition of the light wave output from a tunable optical element, and the electronic signals transformed from the fine-tuning module are processed to obtain an error signal for fine-tuning and servo control of the light wave output from a tunable optical element.

19. The wavelength stabilizing control method set forth according to claim 18, wherein the inputting step further comprises steps of dividing the light wave into a first light wave and a second light wave; dividing the second light wave into a third light wave and a fourth light wave; dividing the fourth light wave into a fifth light wave and a sixth light wave; filtering off part channels of the first light wave; separating a light wave including specific wavelength out of the fifth light wave; and separating a light wave having specific wavelength out of the sixth light wave; and the transforming step further comprises steps of transforming the first light wave of which parts channels being filtered off, the third light wave of which parts channels being filtered off, the light wave with specific wavelength from the fifth wavelength, and the light wave with specific wavelength from the sixth wavelength into a first electronic signal, a second electronic signal, a third electronic signal, and a fourth electronic signal, respectively; and the signal processing step performs coarse-tuning and channel recognition of the light wave output from a tunable optical element on the basis of a voltage ratio of the first electronic signal to the second electronic signal, and performs fine-tuning and servo control of the light wave output from a tunable optical element with an error signal being selected from a voltage difference between the third electronic signal and the fourth electronic signal, and a voltage ratio of the voltage difference between the third electronic signal and the fourth electronic signal to the second electronic signal.

20. The wavelength stabilizing control method set forth according to claim 18, wherein the inputting step further comprises steps of dividing the light wave into a first light wave and a second light wave; dividing the second light wave into a third light wave, a fourth light wave, and a fifth light wave; filtering off part channels of the first light wave; separating a light wave having specific wavelength out of the fourth light wave; and separating a light wave having specific wavelength out of the fifth light wave; and the transforming step further comprises steps of transforming the first light wave of which part channels being filtered off, the third light wave of which part channels being filtered off, the light wave with specific wavelength from the fourth light wave, and the light wave with specific wavelength from the fifth light wave into a first electronic signal, a second electronic signal, a third electronic signal, and a fourth electronic signal; and the signal processing step performs coarse-tuning and channel recognition of the light wave output from a tunable optical element on the basis of a voltage ratio of the first electronic signal to the second electronic signal, and performs fine-tuning and servo control of the light wave output from a tunable optical element with an error signal being selected from a voltage difference between the third electronic signal and the fourth electronic signal, and the voltage ratio of the voltage difference between the third electronic signal and the fourth electronic signal to the second electronic signal.

21. The wavelength stabilizing control method set forth according to claim 18, wherein the inputting step further comprises steps of dividing the light wave into a first light and a second light; dividing the first light wave into a third light wave and a fourth light wave; dividing the second light wave into a fifth light wave and a sixth light wave; separating a light wave having specific wavelength out of the fifth light wave; and separating a light wave having specific wavelength out of the sixth light wave; and the transforming step further comprises steps of transforming the third light wave, the fourth light wave, the light wave with specific wavelength from the fifth light wave, and the light wave with specific wavelength from the sixth light wave into a first electronic signal, a second electronic signal, a third electronic signal, and a fourth electronic signal, respectively; and the signal processing step performs coarse-tuning and channel recognition of the light wave output from a tunable optical element on the basis of a value selected from a voltage ratio of the first electronic signal to the voltage sum of the first electronic signal and the second electronic signal, and a voltage ratio of the voltage difference between the first electronic signal and the second electronic signal to the voltage sum of the first electronic signal and the second electronic signal, and performs fine-tuning and servo control of the light wave output from a tunable optical element with an error signal being selected from a voltage difference between the third signal electronic signal and the fourth electronic signal, and a voltage ratio of the voltage difference between the third electronic signal and the fourth electronic signal to the voltage sum of the first electronic signal and the second electronic signal.

22. The wavelength stabilizing control method set forth according to claim 18, wherein the inputting step further comprises steps of dividing the light wave into a first light wave and a second light wave; separating the first light wave into a third light wave and a fourth light wave; filtering off part channels of the third light wave; dividing the second light wave into a fifth light wave and a sixth light wave; separating a light wave having specific light wave out of the fifth light wave; and separating a light wave having specific wavelength out of the sixth light wave; and the transforming step further comprises steps of transforming the third light wave of which part channels being filtered off, the fourth light wave, the light wave with specific wavelength from the fifth light wave, and the light wave with specific wavelength from the sixth light wave into a first electronic signal, a second electronic signal, a third electronic signal, and a fourth electronic signal, respectively; and the signal processing step performs coarse-tuning and channel recognition of the light wave output from a tunable optical element on the basis of a value selected from a voltage ratio of the first electronic signal to the voltage sum of the first electronic signal and the second electronic signal, and the voltage ratio of the voltage difference between the first electronic signal and the second electronic signal to the voltage sum of the first electronic signal and the second electronic signal, and performs fine-tuning and servo control of the light wave output from a tunable optical element with an error signal being selected from a voltage difference between the third electronic signal and the fourth signal, and a voltage ratio of the voltage difference between the third electronic signal and the fourth electronic signal to the voltage sum of the first electronic signal and the second electronic signal.

23. The wavelength stabilizing control method set forth according to claim 18, wherein the inputting step further comprises steps of dividing the first light wave into the first light wave and the second light wave; dividing the first light wave into a third light wave and a fourth light wave; dividing the second light wave into a fifth light wave and a sixth light wave; separating a light wave with specific wavelength out of the fifth light wave; separating a light wave with specific wavelength out of the sixth light wave; dividing the third light wave into a seventh light wave and a eighth light wave; and filtering off part channels of the seventh light wave; and the transforming step further comprises steps of transforming the seventh light wave of which part channels being filtered off, the eighth light wave, the fourth light wave, the light wave with specific wavelength from the fifth light wave, the light wave with specific wavelength from the sixth light wave into a first electronic signal, a second electronic signal, a third electronic signal, a fourth electronic signal, and a fifth electronic signal, respectively; and the signal processing step performs coarse-tuning and channel recognition of the light wave output from a tunable optical element on the basis of a value selected from a voltage ratio of the third electronic signal to the second electronic signal, and a voltage ratio of the third electronic signal to the first electronic signal, and performs fine-tuning and servo control of the light wave output from a tunable optical element with an error signal selected from a voltage difference between the fourth electronic signal and the fifth electronic signal, and a voltage ratio of the voltage difference between the fourth signal and the fifth electronic signal to the third electronic signal.

24. The wavelength stabilizing control method set forth according to claim 18, wherein the inputting step further comprises steps of dividing the light wave into a first light wave and a second light wave; dividing the first light wave into a third light wave and a fourth light wave; dividing the second the second light wave into a fifth light wave and a sixth light wave; separating a light wave with specific wavelength out of the fifth light wave; separating a light wave with specific wavelength out of the sixth light wave; filtering off part channels of the third light wave; dividing the third light wave with part channels filtered off into a seventh light wave and a eighth wave; and the transforming step further comprises steps of transforming the seventh light wave, the eighth light wave, the fourth light wave, the light wave with specific wavelength from the fifth light wave, and the light wave with specific wavelength from the sixth light wave into a first electronic signal, a second electronic signal, a third electronic signal, a fourth electronic signal, and a fifth electronic signal, respectively; and the signal processing step performs coarse-tuning and channel recognition of the light wave output from a tunable optical element on the basis of a value selected from a voltage ratio of the third electronic signal and the second electronic signal, and a voltage ratio of the third electronic signal to the first electronic signal, and performs fine-tuning and servo control of the light wave output from a tunable optical element with an error signal selected from a voltage difference between the fourth electronic signal and the fifth electronic signal, and a voltage ratio of the voltage difference between the forth electronic signal and fifth electronic signal to the third electronic signal.

25. The wavelength stabilizing control method set forth according to claim 18, wherein the inputting step further comprises steps of dividing the light wave into a first light wave and a second light wave; dividing the first light wave into a third wave and a fourth light wave; dividing the second light wave into a fifth light wave and a sixth light wave; dividing the third light wave into a seventh light wave and a eighth light wave; separating a light wave with specific wavelength out of the fifth light wave; separating a light wave with specific wavelength out of the sixth light wave; filtering off part channels of the seventh light wave; and dividing the seventh light wave of which part channels being filtered off into a ninth light wave and a tenth light wave; and the transforming step further comprises steps of transforming the ninth light wave, the tenth light wave, the eighth light wave, the fourth light wave, the light wave with specific wavelength from the fifth light wave, the light wave with specific wavelength from the sixth light wave into a first electronic signal, a second electronic signal, a third electronic signal, a fourth electronic signal, a fifth electronic signal, and a sixth electronic signal, respectively; and the signal processing step performs coarse-tuning and channel recognition of the light wave output from a tunable optical element on the basis of a value selected from a voltage ratio of the fourth electronic signal and the third electronic signal, a voltage ratio of the fourth electronic signal and the second electronic signal, and a voltage ratio of the fourth electronic signal to the first electronic signal, and performs fine-tuning and servo control of the light wave output from a tunable optical element with an error signal being a voltage difference between the fifth electronic signal and the sixth electronic signal.

26. The wavelength stabilizing control method set forth according to claim 18, wherein the inputting step further comprises steps of dividing the light wave into a first light wave and a second light wave; dividing the first light wave into a third wave and a fourth light wave; dividing the second light wave into a fifth light wave and a sixth light wave; filtering off part channels of the third light wave; separating a light wave with specific wavelength out of the fifth light wave; separating a light wave with specific wavelength out of the sixth light wave; dividing the third light wave of which part channels being filtered off into a seventh light wave and an eighth light wave; filtering off part channels of the seventh light wave; dividing the seven light wave of which part channels being filtered off into a ninth light wave and a tenth light wave; and filtering off part channels of the ninth light wave; and the transforming step further comprises steps of transforming the ninth light wave of which part channels being filtered off, the tenth light wave, the eighth light wave, the fourth light wave, the light wave with specific wavelength from the fifth light wave, the light wave with specific wavelength from the sixth light wave into a first electronic signal, a second electronic signal, a third electronic signal, a fourth electronic signal, a fifth electronic signal, and a sixth electronic signal, respectively; and the signal processing step performs coarse-tuning and channel recognition of the light wave output from a tunable optical element on the basis of a value selected from a voltage ratio of the fourth electronic signal and the third electronic signal, a voltage ratio of the fourth electronic signal and the second electronic signal, and a voltage ratio of the fourth electronic signal to the first electronic signal, and performs fine-tuning and servo control of the light wave output from a tunable optical element with an error signal being a voltage difference between the fifth electronic signal and the sixth electronic signal.

* * * * *

UNITED STATES PATENT AND TRADEMARK OFFICE

CERTIFICATE OF CORRECTION

PATENT NO. : 6,973,228 B2
DATED : December 6, 2005
INVENTOR(S) : Chii-How Chang and Sean Chang It is certified that error appears in the above-identified patent and that said Letters Patent is hereby corrected as shown below:

Title page,
Item [73], Assignee, change "Delta Electrics, Inc." to -- Delta Electronics, Inc. --.

Signed and Sealed this

Ninth Day of May, 2006

JON W. DUDAS
*Director of the United States Patent and Trademark Office*